(12) United States Patent
Rice et al.

(10) Patent No.: US 7,243,003 B2
(45) Date of Patent: *Jul. 10, 2007

(54) SUBSTRATE CARRIER HANDLER THAT UNLOADS SUBSTRATE CARRIERS DIRECTLY FROM A MOVING CONVEYOR

(75) Inventors: Michael Robert Rice, Pleasanton, CA (US); Martin R. Elliott, Round Rock, TX (US); Robert B. Lowrance, Los Gatos, CA (US); Jeffrey C. Hudgens, San Francisco, CA (US); Eric Andrew Englhardt, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 246 days.

This patent is subject to a terminal disclaimer.

(21) Appl. No.: 10/650,480

(22) Filed: Aug. 28, 2003

(65) Prior Publication Data
US 2004/0081538 A1    Apr. 29, 2004

Related U.S. Application Data

(60) Provisional application No. 60/407,463, filed on Aug. 31, 2002, provisional application No. 60/443,004, filed on Jan. 27, 2003.

(51) Int. Cl.
*G06F 19/00* (2006.01)

(52) U.S. Cl. .................. 700/245; 414/217; 414/219; 414/249; 451/5

(58) Field of Classification Search ............ 700/245; 414/217, 219, 736, 940, 941, 811, 805, 937, 414/236, 416.03, 222.11, 222.01; 198/475.1, 198/346.2; 451/5, 41, 288, 66; 83/13, 73, 83/279

See application file for complete search history.

(56) References Cited

U.S. PATENT DOCUMENTS

| | | | |
|---|---|---|---|
| 1,639,758 A | 8/1927 | Webb | |
| 1,906,036 A | 4/1933 | Wunderlich | |
| 2,153,071 A | 4/1939 | Bishop | |
| 2,949,996 A | 8/1960 | Tonelli | |
| 3,058,604 A | 10/1962 | Harper et al. | |
| 3,131,801 A | 5/1964 | Marchetti | |
| 3,184,032 A | 5/1965 | Jonsson | |
| 3,587,817 A | 6/1971 | Bornstein et al. | |
| 3,610,448 A | 10/1971 | Bornfleth | |
| 3,710,921 A | 1/1973 | Petiet | |
| 3,710,923 A | 1/1973 | Fromme et al. | |

(Continued)

FOREIGN PATENT DOCUMENTS

EP    0277536 A1    8/1988

(Continued)

OTHER PUBLICATIONS

Viralo, T.K., "Cylinder Speed Synchronization", Dec. 1978, Hydraulics and Pneumatics, vol. 31, No. 12, pp. 55-57.

(Continued)

*Primary Examiner*—Thomas G. Black
*Assistant Examiner*—McDieunel Marc
(74) *Attorney, Agent, or Firm*—Dugan & Dugan

(57) ABSTRACT

In a first aspect, a substrate loading station is served by a conveyor which continuously transports substrate carriers. A substrate carrier handler that is part of the substrate loading station operates to exchange substrate carriers with the conveyor while the conveyor is in motion. A carrier exchange procedure may include moving an end effector of the substrate carrier handler at a velocity that substantially matches a velocity of the conveyor. Numerous other aspects are provided.

90 Claims, 25 Drawing Sheets

U.S. PATENT DOCUMENTS

| | | | |
|---|---|---|---|
| 3,722,656 A | 3/1973 | Loomis, Jr. et al. | |
| 3,734,263 A | 5/1973 | Dirks | |
| 3,815,723 A | 6/1974 | Wright et al. | |
| 3,845,286 A | 10/1974 | Aronstein et al. | |
| 3,901,376 A | 8/1975 | Dardaine et al. | |
| 3,990,569 A | 11/1976 | Aiuola | |
| 4,006,813 A | 2/1977 | Fluck | |
| 4,027,246 A | 5/1977 | Caccoma et al. | |
| 4,029,194 A | 6/1977 | Feurstein et al. | |
| 4,033,403 A | 7/1977 | Seaton et al. | |
| 4,040,302 A | 8/1977 | Katarao | |
| 4,044,886 A | 8/1977 | Sender | |
| 4,166,527 A | 9/1979 | Beezer | |
| 4,222,479 A | 9/1980 | Dugan et al. | |
| 4,261,236 A | 4/1981 | Verjux | |
| 4,266,652 A | 5/1981 | Bald | |
| 4,294,344 A | 10/1981 | van Maanen | |
| 4,340,137 A | 7/1982 | Foster | |
| 4,401,522 A | 8/1983 | Buschow et al. | |
| 4,450,950 A | 5/1984 | Foote, Jr. | |
| 4,506,779 A | 3/1985 | Seragnoli | |
| 4,524,858 A | 6/1985 | Maxey | |
| 4,534,843 A | 8/1985 | Johnson et al. | |
| 4,538,720 A | 9/1985 | Limousin | |
| 4,540,088 A | 9/1985 | Bergh | |
| 4,549,647 A | 10/1985 | Cosse | |
| 4,552,261 A | 11/1985 | Raudat et al. | |
| 4,584,944 A | 4/1986 | Dehne | |
| 4,585,126 A | 4/1986 | Paddock et al. | |
| 4,603,770 A | 8/1986 | Hartness | |
| 4,650,264 A | 3/1987 | Dahnert | |
| 4,653,630 A | 3/1987 | Bravin | |
| 4,667,809 A | 5/1987 | Raybuck | |
| 4,679,685 A | 7/1987 | Inoko | |
| 4,680,919 A | 7/1987 | Hirama et al. | |
| 4,693,359 A | 9/1987 | Mattei et al. | |
| 4,702,365 A | 10/1987 | Pak | |
| 4,708,727 A | 11/1987 | Cardenas-Franco et al. | |
| 4,720,006 A | 1/1988 | Lenherr | |
| 4,730,733 A | 3/1988 | Kawamura et al. | |
| 4,750,605 A | 6/1988 | Brems et al. | |
| 4,759,439 A | 7/1988 | Hartlepp | |
| 4,765,453 A | 8/1988 | Bucher | |
| 4,775,046 A | 10/1988 | Gramarossa et al. | |
| 4,805,759 A | 2/1989 | Rochet et al. | |
| 4,813,528 A | 3/1989 | Hartlepp | |
| 4,830,180 A | 5/1989 | Ferguson et al. | |
| 4,850,102 A | 7/1989 | Hironaka et al. | |
| 4,852,717 A | 8/1989 | Ross et al. | |
| 4,854,440 A | 8/1989 | Laube et al. | |
| 4,869,637 A | 9/1989 | deGroot | |
| 4,898,373 A | 2/1990 | Newsome | |
| 4,901,843 A | 2/1990 | Lashyro | |
| 4,921,092 A | 5/1990 | Crawford et al. | |
| 4,936,438 A | 6/1990 | Waineo | |
| 5,048,164 A | 9/1991 | Harima | |
| 5,052,544 A | 10/1991 | Anderson | |
| 5,086,909 A | 2/1992 | Powell, Jr. | |
| 5,092,450 A | 3/1992 | Schommartz et al. | |
| 5,099,896 A | 3/1992 | Ritola | |
| 5,110,249 A | 5/1992 | Norman | |
| 5,113,992 A | 5/1992 | Sadamori | |
| 5,123,518 A | 6/1992 | Pfaff | |
| 5,135,102 A | 8/1992 | Sjogren et al. | |
| 5,184,712 A | 2/1993 | Leypold et al. | |
| 5,207,309 A | 5/1993 | Simpkin et al. | |
| 5,226,211 A | 7/1993 | Jones | |
| 5,231,926 A | 8/1993 | Williams et al. | |
| 5,256,204 A | 10/1993 | Wu | |
| 5,261,935 A | 11/1993 | Ishii et al. | |
| 5,269,119 A | 12/1993 | Tolson | |
| 5,275,275 A | 1/1994 | Boldrini et al. | |
| 5,332,013 A | 7/1994 | Sugita et al. | |
| 5,341,915 A | 8/1994 | Cordia et al. | |
| 5,372,471 A | 12/1994 | Wu | |
| 5,382,127 A | 1/1995 | Garric et al. | |
| 5,388,945 A | 2/1995 | Garric et al. | |
| 5,390,785 A | 2/1995 | Garric et al. | |
| 5,411,358 A | 5/1995 | Garric et al. | |
| 5,439,091 A | 8/1995 | Mason | |
| 5,460,478 A * | 10/1995 | Akimoto et al. | 414/811 |
| 5,558,198 A | 9/1996 | Juarez | |
| 5,560,471 A | 10/1996 | Prochut et al. | |
| 5,570,990 A | 11/1996 | Bonora et al. | |
| 5,603,777 A | 2/1997 | Ohashi | |
| 5,612,886 A | 3/1997 | Weng | |
| 5,617,944 A | 4/1997 | McTaggart | |
| 5,628,614 A | 5/1997 | Pazdernik et al. | |
| 5,653,327 A | 8/1997 | Buday, Jr. et al. | |
| 5,664,254 A | 9/1997 | Ohkura et al. | |
| 5,667,056 A | 9/1997 | Kimmet | |
| 5,668,056 A | 9/1997 | Wu et al. | |
| 5,762,544 A | 6/1998 | Zuniga et al. | 451/285 |
| 5,782,338 A | 7/1998 | Schuster et al. | |
| 5,797,249 A | 8/1998 | Hartness | |
| 5,818,716 A | 10/1998 | Chin et al. | |
| 5,823,319 A | 10/1998 | Resnick et al. | |
| 5,827,118 A | 10/1998 | Johnson et al. | |
| 5,829,574 A | 11/1998 | DelSanto | |
| 5,829,939 A | 11/1998 | Iwai et al. | |
| 5,865,292 A | 2/1999 | Aguilar et al. | |
| 5,884,392 A | 3/1999 | Lafond | |
| 5,887,701 A | 3/1999 | Spatafora | |
| 5,888,042 A | 3/1999 | Oda | |
| 5,957,648 A * | 9/1999 | Bachrach | 414/217 |
| 5,976,199 A | 11/1999 | Wu et al. | |
| 6,026,561 A | 2/2000 | Lafond | |
| 6,036,426 A | 3/2000 | Hillman | |
| 6,048,259 A | 4/2000 | Asai | |
| 6,054,181 A | 4/2000 | Nanbu et al. | |
| 6,082,948 A | 7/2000 | Fishkin et al. | |
| 6,083,566 A * | 7/2000 | Whitesell | 427/445 |
| 6,092,979 A | 7/2000 | Miselli | |
| 6,183,186 B1 | 2/2001 | Howells et al. | |
| 6,209,710 B1 | 4/2001 | Mueller et al. | |
| 6,223,887 B1 | 5/2001 | Andou | |
| 6,227,345 B1 | 5/2001 | Miyamoto | |
| 6,227,346 B1 | 5/2001 | Lecomte et al. | |
| 6,227,348 B1 | 5/2001 | Frei et al. | |
| 6,234,300 B1 | 5/2001 | De Vos et al. | |
| 6,235,634 B1 | 5/2001 | White et al. | |
| 6,283,692 B1 | 9/2001 | Perlov et al. | |
| 6,309,279 B1 * | 10/2001 | Bowman et al. | 451/41 |
| 6,435,331 B1 | 8/2002 | Olson et al. | |
| 6,439,822 B1 | 8/2002 | Kimura et al. | |
| 6,440,178 B2 * | 8/2002 | Berner et al. | 29/25.01 |
| 6,511,065 B1 | 1/2003 | Cote et al. | |
| 6,524,463 B2 | 2/2003 | Gramarossa et al. | |
| 6,581,750 B1 | 6/2003 | Tweedy et al. | |
| 6,699,329 B2 | 3/2004 | Mueller et al. | |
| 6,826,986 B2 * | 12/2004 | Lim et al. | 83/13 |
| 6,919,001 B2 | 7/2005 | Fairbairn et al. | |
| 2002/0090282 A1 | 7/2002 | Bachrach | |
| 2003/0010449 A1 | 1/2003 | Gramarossa et al. | |
| 2004/0062633 A1* | 4/2004 | Rice et al. | 414/935 |
| 2004/0076496 A1* | 4/2004 | Elliott et al. | 414/217 |
| 2004/0081538 A1* | 4/2004 | Rice et al. | 414/222.01 |
| 2004/0081545 A1* | 4/2004 | Elliott et al. | 414/805 |
| 2004/0081546 A1* | 4/2004 | Elliott et al. | 414/805 |
| 2004/0191030 A1* | 9/2004 | Rice et al. | 414/222.01 |
| 2004/0193300 A1* | 9/2004 | Rice et al. | 700/101 |
| 2005/0095110 A1* | 5/2005 | Lowrance et al. | 414/736 |
| 2005/0186063 A1* | 8/2005 | Rice et al. | 414/800 |

2005/0273191 A1* 12/2005 Englhardt et al. .......... 700/112

FOREIGN PATENT DOCUMENTS

| EP | 0 365 589 B1 | 9/1992 |
|---|---|---|
| EP | 0 582 019 A1 | 2/1994 |
| EP | 0 663 686 A1 | 7/1995 |
| EP | 0717717 B1 | 7/1999 |
| EP | 00735927 B1 | 11/1999 |
| EP | 0 987 750 A1 | 3/2000 |
| EP | 00912426 B1 | 8/2000 |
| EP | 1 134 641 A1 | 9/2001 |
| JP | 63020151 A2 | 1/1988 |
| JP | 02098157 A | 4/1990 |
| JP | 10-256346 | 9/1998 |
| JP | 10256346 A | 9/1998 |
| JP | 00062949 A | 2/2000 |
| JP | 00335799 A | 12/2000 |
| WO | WO 97/09256 A1 | 3/1997 |
| WO | WO 99/64207 | 12/1999 |
| WO | WO 00/69724 A1 | 11/2000 |
| WO | WO 02/19392 A1 | 3/2002 |

OTHER PUBLICATIONS

Cheng, et al., "Adaptive Synchronization Control of a Robotic Manipulator Operating in an Intelligent Workcell", Apr. 1990, IEEE Transactions on Industrial Electronics, vol. 37, No. 2, pp. 119-126.

Shih-Hung Li, et al. "An Ultrahigh Speed Assembly Robot System. Part I. Design", 1994, Proceedings 1994 Japan-U.S.A. Symposium on Flexible Automation—A Pacific Rim Conference, vol. 2, pp. 465-472.

Roberts, et al., "Feed Chute Geometry for Minimum Belt Wear", Sep. 1998, 6th International Conference on Bulk Materials Storage, Handling and Transportation, pp. 153-159.

Saigo, et al., "Drive Control Systems for Processing Lines", Nov. 10, 2000, Fuji Jiho (Fuji Electric Journal), vol. 73, No. 11, pp. 45-49, Japanese language (Abstract only).

Saigo, K., "Variable-speed Drive Systems for Industrial Plants", Nov. 10, 2000, Fuji Jiho (Fuji Electric Journal), vol. 73, No. 11, pp. 10-14, Japanese language (Abstract only).

Park, et al., "Task Sequence Optimization for a Dual-Robot Assembly System using Evolutionary Algorithms", 2001, Proceedings of the Institution of Mechanical Engineers, Part B (Journal of Engineering Manufacture), vol. 215, No. B6, pp. 835-846.

* cited by examiner

SUBSTRATE CARRIER HANDLER THAT UNLOADS SUBSTRATE CARRIERS DIRECTLY FROM A MOVING CONVEYOR

This application claims priority from U.S. Provisional Patent Application Ser. No. 60/407,463, filed Aug. 31, 2002 and U.S. Provisional Patent Application Ser. No. 60/443,004, filed Jan. 27, 2003, both of which are hereby incorporated by reference herein in their entirety.

FIELD OF THE INVENTION

The present invention relates generally to semiconductor device fabrication systems, and is more particularly concerned with transportation of substrate carriers within a fabrication facility.

CROSS REFERENCE TO RELATED APPLICATIONS

The present application is related to the following commonly-assigned, co-pending U.S. Patent Applications, each of which is hereby incorporated by reference herein in its entirety:
U.S. Provisional Patent Application Ser. No. 60/407,451, filed Aug. 31, 2002 and titled "System For Transporting Wafer Carriers";
U.S. Provisional Patent Application Ser. No. 60/407,339, filed Aug. 31, 2002 and titled "Method and Apparatus for Using Wafer Carrier Movement to Actuate Wafer Carrier Door Opening/Closing";
U.S. Provisional Patent Application Ser. No. 60/407,474, filed Aug. 31, 2002 and titled "Method and Apparatus for Unloading Wafer Carriers from Wafer Carrier Transport System";
U.S. Provisional Patent Application Ser. No. 60/407,336, filed Aug. 31, 2002 and titled "Method and Apparatus for Supplying Wafers to a Processing Tool";
U.S. Provisional Patent Application Ser. No. 60/407,452, filed Aug. 31, 2002 and titled "End Effector Having Mechanism For Reorienting A Wafer Carrier Between Vertical And Horizontal Orientations";
U.S. Provisional Patent Application Ser. No. 60/407,337, filed Aug. 31, 2002, and titled "Wafer Loading Station with Docking Grippers at Docking Stations";
U.S. Provisional Patent Application Ser. No. 60/407,340, filed Aug. 31, 2002 and titled "Wafer Carrier having Door Latching and Wafer Clamping Mechanisms";
U.S. Provisional Patent Application Ser. No. 60/443,087, filed Jan. 27, 2003 and titled "Methods and Apparatus for Transporting Wafer Carriers";
U.S. Provisional Patent Application Ser. No. 60/443,153, filed Jan. 27, 2003 and titled "Overhead Transfer Flange and Support for Suspending Wafer Carrier";
U.S. Provisional Patent Application Ser. No. 60/443,001, filed Jan. 27, 2003 and titled "Systems and Methods for Transferring Wafer Carriers Between Processing Tools"; and
U.S. Provisional Patent Application Ser. No. 60/443,115, filed Jan. 27, 2003 and titled "Apparatus and Method for Storing and Loading Wafer Carriers".

BACKGROUND OF THE INVENTION

Manufacturing of semiconductor devices typically involves performing a sequence of procedures with respect to a substrate such as a silicon substrate, a glass plate, etc. (Such substrates may also be referred to as wafers, whether patterned or unpatterned.) These steps may include polishing, deposition, etching, photolithography, heat treatment, and so forth. Usually a number of different processing steps may be performed in a single processing system or "tool" which includes a plurality of processing chambers. However, it is generally the case that other processes are required to be performed at other processing locations within a fabrication facility, and it is accordingly necessary that substrates be transported within the fabrication facility from one processing location to another. Depending upon the type of semiconductor device to be manufactured, there may be a relatively large number of processing steps required to be performed at many different processing locations within the fabrication facility.

It is conventional to transport substrates from one processing location to another within substrate carriers such as sealed pods, cassettes, containers and so forth. It is also conventional to employ automated substrate carrier transport devices, such as automatic guided vehicles, overhead transport systems, substrate carrier handling robots, etc., to move substrate carriers from location to location within the fabrication facility or to transfer substrate carriers from or to a substrate carrier transport device.

For an individual substrate, the total fabrication process, from formation or receipt of the virgin substrate to cutting of semiconductor devices from the finished substrate, may require an elapsed time that is measured in weeks or months. In a typical fabrication facility, a large number of substrates may accordingly be present at any given time as "work in progress" (WIP). The substrates present in the fabrication facility as WIP may represent a very large investment of working capital, which tends to increase the per substrate manufacturing cost. It would therefore be desirable to reduce the amount of WIP for a given substrate throughput for the fabrication facility. To do so, the total elapsed time for processing each substrate should be reduced.

SUMMARY OF THE INVENTION

In a first aspect of the invention, a first apparatus is provided that is adapted to supply substrates to a processing tool. The first apparatus includes a substrate carrier handler adapted to transport a substrate carrier to a first load port of the processing tool. The substrate carrier handler including an end effector adapted to support the substrate carrier. A controller is coupled to the substrate carrier handler and operative to control the substrate carrier handler such that the end effector of the substrate carrier handler disengages the substrate carrier from a substrate carrier conveyor while the substrate carrier is in motion and being transported by the substrate carrier conveyor.

In a second aspect of the invention, a second apparatus is provided that is adapted to supply substrates to a processing tool. The second apparatus includes a substrate carrier handler adapted to transport a substrate carrier to a first load port of the processing tool. The substrate carrier handler includes (1) a vertical guide; (2) a horizontal guide coupled to the vertical guide; and (3) an end effector adapted to support the substrate carrier and to move vertically relative to the vertical guide and horizontally relative to the horizontal guide. A controller is coupled to the substrate carrier handler and operative to control the substrate carrier handler such that the end effector of the substrate carrier handler disengages the substrate carrier from a substrate carrier conveyor positioned adjacent the substrate carrier handler.

In a third aspect of the invention, a third apparatus is provided that is adapted to supply substrates to a processing tool. The third apparatus includes a substrate carrier handler adapted to transport a substrate carrier to a first load port of the processing tool. The substrate carrier handler includes an end effector adapted to support the substrate carrier. A controller is coupled to the substrate carrier handler and operative to control the substrate carrier handler to (1) move the end effector of the substrate carrier handler in a horizontal direction to substantially match a motion of the substrate carrier as the substrate carrier is being transported by a substrate carrier conveyor; (2) raise the end effector to engage the substrate carrier and to disengage the substrate carrier from the substrate carrier conveyor; and (3) transport the substrate carrier to the first load port. Numerous other aspects are provided, as are systems, methods and computer program products in accordance with these and other aspects of the invention.

The methods and apparatus of the present invention provide for an efficient and reliable arrangement for exchanging substrate carriers with a conveyor that remains in motion during the exchange. The inventive methods and apparatus are particularly advantageous in that a substrate carrier handler, which is customarily provided as part of a substrate loading station, may be operated in accordance with the invention so that no additional equipment is required to exchange substrate carriers with a conveyor while the conveyor is in motion.

Other features and aspects of the present invention will become more fully apparent from the following detailed description of exemplary embodiments, the appended claims and the accompanying drawings.

DETAILED DESCRIPTION

Previously incorporated, U.S. patent application Ser. No. 60/407,451, filed Aug. 31, 2002, entitled "System for Transporting Semiconductor Wafer Carriers", discloses a substrate carrier transport system that includes a conveyor for substrate carriers that is intended to be constantly in motion during operation of the fabrication facility which it serves. The constantly moving conveyor is intended to facilitate transportation of substrates within the fabrication facility so as to reduce the total "dwell" time of each substrate in the fabrication facility; thereby reducing WIP, and cutting capital and manufacturing costs. To operate a fabrication facility in this manner, methods and apparatus should be provided for unloading substrate carriers from the conveyor, and for loading substrate carriers onto the conveyor, while the conveyor is in motion.

In accordance with at least one aspect of the invention, a substrate carrier handler at a substrate loading station includes a horizontal guide that is moveable vertically along parallel vertical guides, and an end effector that is moveable horizontally along the horizontal guide. To unload a substrate carrier from a moving conveyor that transfers substrate carriers (a "substrate carrier conveyor") and that passes by the substrate loading station, the end effector is moved along the horizontal guide at a velocity that substantially matches the velocity of the substrate carrier as it is being transported by the substrate carrier conveyor (e.g., by substantially matching substrate carrier speed in a horizontal direction). In addition, the end effector may be maintained in a position adjacent the substrate carrier as the substrate carrier is being transported. The end effector thus may substantially match a position of the substrate carrier while substantially matching a velocity of the substrate carrier. Likewise, conveyor position and/or velocity may be substantially matched.

While the end effector substantially matches the substrate carrier's velocity (and/or position), the end effector is raised, by moving the horizontal guide upwardly along the vertical guides, so that the end effector contacts the substrate carrier and disengages the substrate carrier from the substrate carrier conveyor. A substrate carrier similarly may be loaded onto the moving substrate carrier conveyor by substantially matching end effector and conveyor velocities (and/or positions) during loading. In at least one embodiment of the invention, such substrate carrier handoffs between the end effector and substrate carrier conveyor are performed at a substantially zero velocity and/or acceleration between the end effector and the substrate carrier. Numerous other aspects of the invention are provided, as described further below.

Figure 1:
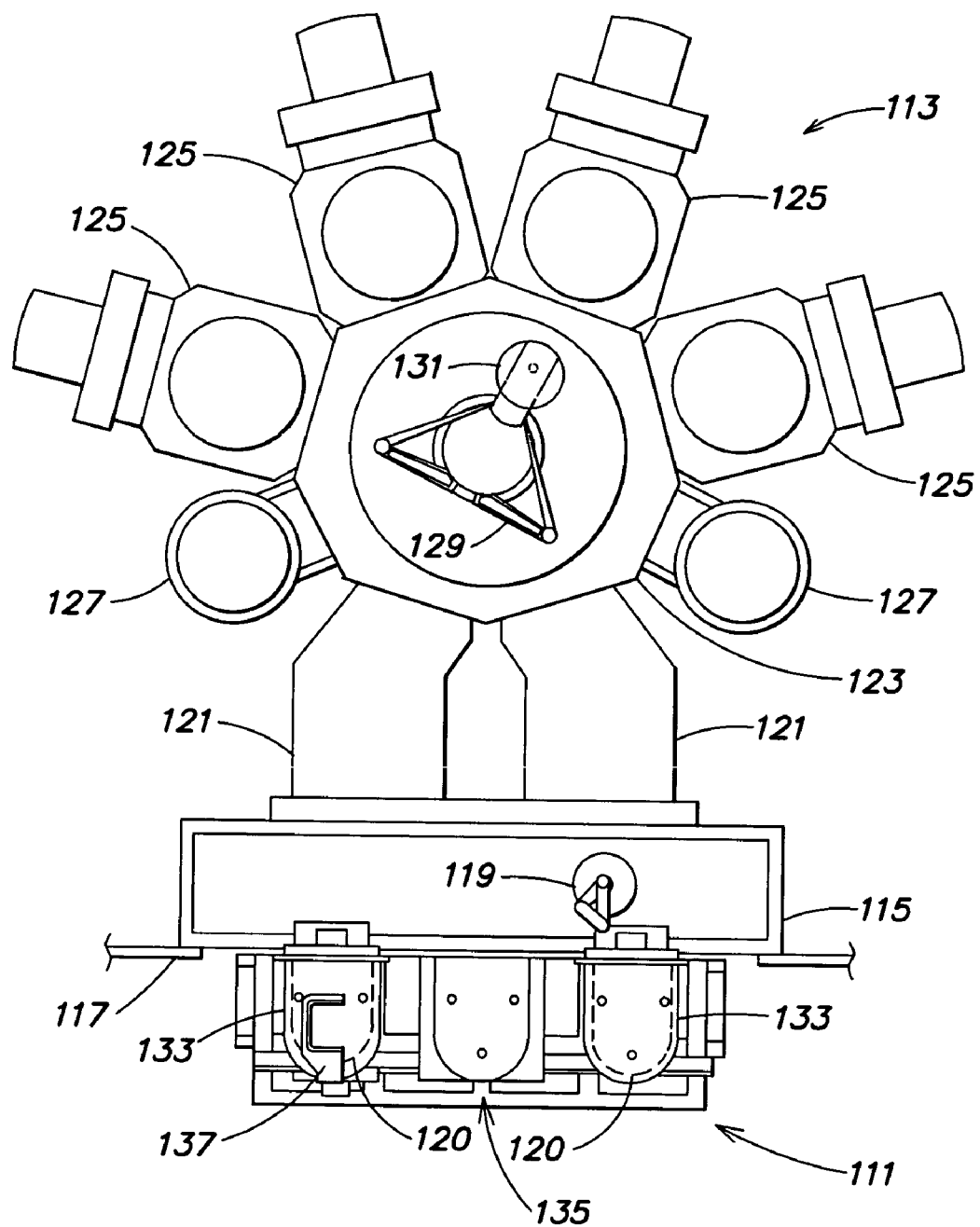
FIG. 1 is a top plan view of a conventional arrangement of a processing tool and an associated substrate carrier loading and storage apparatus.

FIG. 1 is a top plan view showing a conventional loading and storing apparatus 111 in position for storing substrate carriers adjacent a conventional processing tool 113. A factory interface (FI) 115 is shown positioned between the loading and storage apparatus 111 and the processing tool 113. The loading and storage apparatus 111 is positioned adjacent a first side of a clean room wall 117 and the factory interface 115 is positioned adjacent a second side of the clean room wall 117. The factory interface 115 includes an FI robot 119 that may move horizontally along a track (not shown) that is parallel to the clean room wall 117 and may extract a substrate (not shown) from one or more substrate carriers 120 present at the loading and storage apparatus 111.

The FI robot 119 may transport the substrate to a load lock chamber 121 of the processing tool 113.

The load lock chambers 121 shown in FIG. 1 are coupled to a transfer chamber 123 of the processing tool 113. Also coupled to the transfer chamber 123 are processing chambers 125 and auxiliary processing chambers 127. Each of the processing chambers 125 and auxiliary processing chambers 127 may be arranged to perform a conventional semiconductor device fabrication process such as oxidation, thin film deposition, etching, heat treatment, degassing, cool down, etc. A substrate handling robot 129 is disposed within the transfer chamber 123 to transfer substrates, such as substrate 131, among the processing chambers 125, 127 and the load lock chambers 121.

The loading and storage apparatus 111 includes one or more substrate carrier storage shelves 133 for storing substrate carriers before or after the substrates contained in the substrate carriers are processed by the processing tool 113. The loading and storage apparatus 111 also includes one or more docking stations (which are not shown but may be, for example, below the storage shelves 133). A substrate carrier may be docked at a docking station for extraction of substrates therefrom by the FI robot 119. Also included in the loading and storage apparatus 111 is a factory load location 135, at which a substrate carrier transport device, such as an automatic guided vehicle (AGV), may deposit or pick up a substrate carrier.

The loading and storage apparatus 111 further includes a substrate carrier handler 137 which is adapted to move substrate carriers among the factory load location 135, the storage shelves 133 and the docking stations.

In line with the above-noted goal of facilitating transport of substrates within a fabrication facility, it may be desirable to transport substrate carriers to and from a substrate loading station such as the loading and storage apparatus 111 by means of a substrate carrier conveyor that is constantly in motion (e.g., to reduce dwell time and thus work in progress and manufacturing costs). Consequently, in accordance with the present invention, an inventive substrate loading station is provided that can unload substrate carriers from a substrate carrier conveyor, and that can load substrate carriers onto the substrate carrier conveyor, while the substrate carrier conveyor is moving.

Figure 2A:
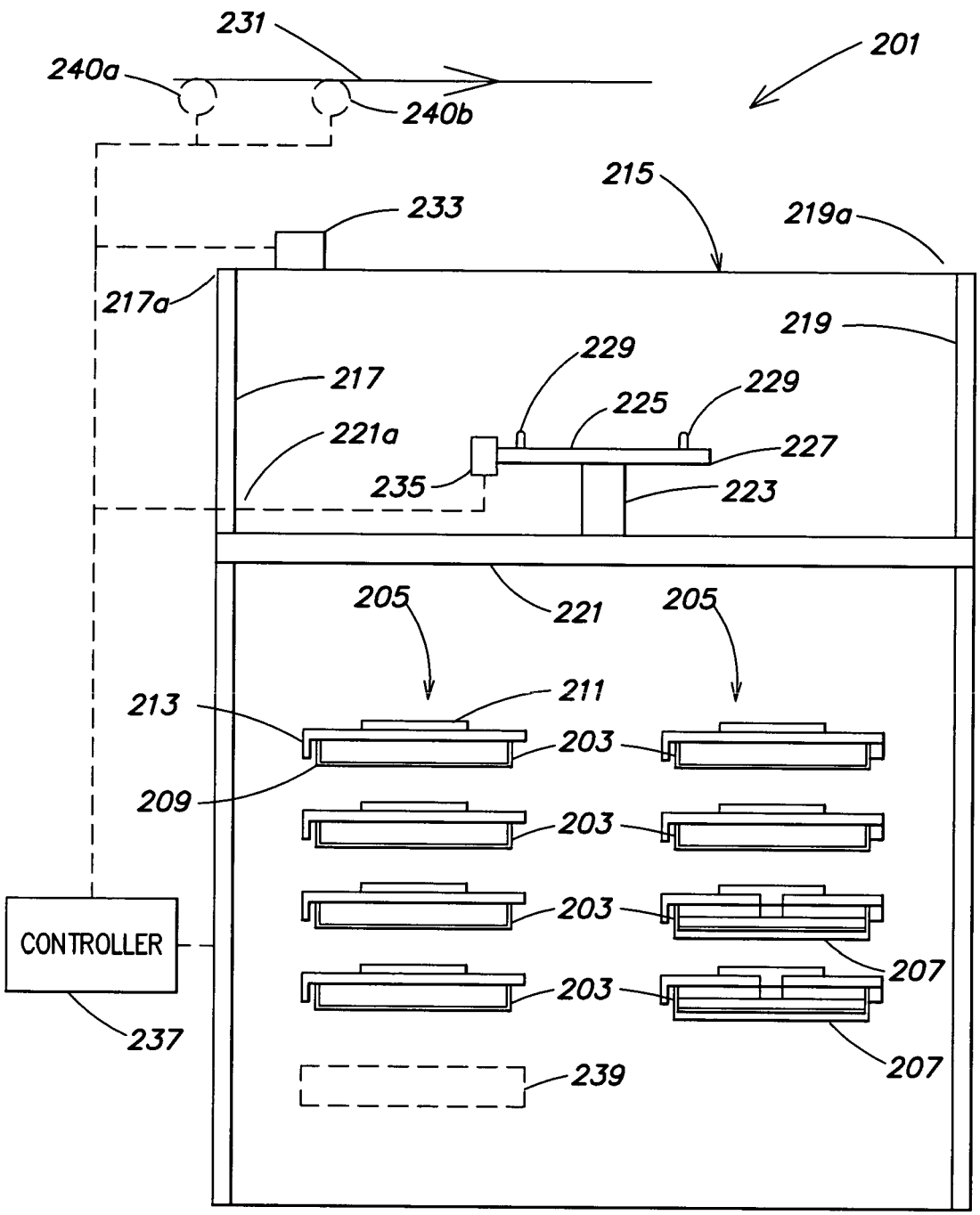
FIG. 2A is a front elevational view of a substrate loading station provided in accordance with the present invention.

An embodiment of the invention will now be described with reference to FIGS. 2A–6E. FIG. 2A is a front elevational view of a substrate loading station 201 provided in accordance with the invention. Although not shown in FIG. 2A, it should be understood that the inventive substrate loading station 201 may be associated with a processing tool and/or factory interface of the kind described in connection with FIG. 1.

The substrate loading station 201 may include one or more load ports or similar locations where substrates or substrate carriers are placed for transfer to and/or from a processing tool (e.g., one or more docking stations 203, although transfer locations that do not employ docking/undocking movement may be employed). In the particular embodiment shown in FIG. 2A, the substrate loading station 201 includes a total of eight docking stations 203, arranged in two columns 205 of four docking stations each. Other numbers of columns and/or docking stations may be employed. Each docking station 203 is adapted to support and/or dock a substrate carrier 207 at the docking station 203 and to allow a substrate (not shown) to be extracted from the substrate carrier 207 at the docking station 203 and transferred to a processing tool such as the processing tool 113 of FIG. 1 (e.g., by a factory interface robot, such as the factory interface robot 119 of FIG. 1). In one embodiment of the invention, the substrate carriers 207 are single substrate carriers. "Single substrate carrier" will be understood to mean a substrate carrier shaped and sized to contain only one substrate at a time. Substrate carriers that hold more than one substrate also may be employed (e.g., 25 or any other number). (Alternatively, one or more docking stations 203 may be adapted to directly support a substrate without a substrate carrier). Each docking station 203 may be configured, for example, as described in previously incorporated U.S. patent application Ser. No. 60/407,337, filed Aug. 31, 2002 and titled "Wafer Loading Station with Docking Grippers at Docking Stations". Other docking station configurations may be employed.

Each docking station 203 may include a port 209 through which a substrate may be transferred to the factory interface (e.g., factory interface 115 in FIG. 1). Adjacent each port 209 is a docking gripper 211 which is adapted to suspend a substrate carrier 207 and to move the suspended substrate carrier between a docked and undocked position. A moveable stage or other support (not shown) alternatively may be employed to support (e.g., from below or otherwise) and/or dock/undock each substrate carrier 207 at each docking station 203. Each port 209 may also include a substrate carrier opener 213 which, in one aspect, is adapted to employ docking movement of a substrate carrier 207 to open the substrate carrier 207 as it moves from an undocked position to a docked position as described in previously incorporated, U.S. patent application Ser. No. 60/407,339, filed Aug. 31, 2002, entitled "METHOD AND APPARATUS FOR USING WAFER CARRIER MOVEMENT TO ACTUATE WAFER CARRIER DOOR OPENING/CLOSING". Each substrate carrier 207 may have, for example, the carrier door latching and/or substrate clamping features disclosed in previously incorporated, U.S. patent application Ser. No. 60/407,340, filed Aug. 31, 2002, entitled "WAFER CARRIER HAVING DOOR LATCHING AND WAFER CLAMPING MECHANISMS". Other substrate carrier opener, door latching, and/or substrate clamping configurations may be employed.

The substrate loading station 201 also includes a substrate carrier handler 215 which operates in accordance with an aspect of the invention. In one or more embodiments of the invention, the substrate carrier handler 215 includes a pair of vertical guides 217, 219 and a horizontal guide 221 which is mounted for vertical movement on the vertical guides 217, 219. A belt drive or a lead screw and an associated motor or motors (which are not shown) or other suitable mechanism is provided to drive the horizontal guide 221 for vertical movement along the vertical guides 217, 219. A support 223 is mounted on the horizontal guide 221 for horizontal movement along the horizontal guide 221. A belt drive or lead screw, and associated motor or motors (which are not shown) or other suitable mechanism is provided to move the support 223 horizontally along the horizontal guide 221.

In at least one embodiment of the invention, the vertical guides 217, 219 may each comprise an integrated guide/driving mechanism such as Part No. 1140-260-10, 1768 mm available from Bosch, Inc. Likewise, the horizontal guide 221 may comprise an integrated guide/driving mechanism such as Part No. 1140-260-10, 1468 mm also available from Bosch, Inc. Other guide/driving mechanism systems may be employed.

An end effector 225 is mounted on the support 223. The end effector 225 may be, for example, in the form of a horizontally-oriented platform 227 adapted to support a substrate carrier (e.g., one of the substrate carriers 207). In at least one embodiment, the platform 227 may have kinematic pins or other kinematic positioning features 229. (Although only two kinematic features 229 are shown in FIG. 2A, other numbers of kinematic pins or features such as three or more may be provided on the platform 227.) The kinematic features 229 may cooperate with concave or otherwise shaped features (not shown in FIG. 2A) on the bottom of the substrate carrier 207 to guide the substrate carrier 207 into correct (positive) positioning on the platform 227. In at least one embodiment of the invention, the end effector 225 may comprise, for example, an end effector capable of changing the orientation of a substrate carrier from vertical to horizontal and vice versa as described in previously incorporated, U.S. patent application serial No. 60/407,452, filed Aug. 31, 2002 and titled "End Effector Having Mechanism For Reorienting A Wafer Carrier Between Vertical And Horizontal Orientations" (Attorney Docket No. 7097). Any other suitable end effector also may be employed.

A continuously or otherwise moving conveyor, schematically represented by an arrow 231, is positioned above the substrate loading station 201 and the substrate carrier handler 215. The conveyor 231 is adapted to transport substrate carriers such as the substrate carriers 207 to and from the substrate loading station 201. In one embodiment of the invention, the continuously moving conveyor 231 may be implemented as a ribbon of stainless steel or similar material as described in previously incorporated U.S. patent application Ser. No. 60/443,087, filed Jan. 27, 2003. The present invention similarly may be employed with any other type of continuously or otherwise moving conveyor.

The substrate loading station 201 may include one or more sensors 233, 235 for detecting movement and/or positions of (1) the conveyor; (2) components of the conveyor 231 (e.g., components used to support substrate carriers being transported by the conveyor 231 as described further below with reference to FIGS. 4A–4E, 6A–6E and 7C–7D); and/or (3) substrate carriers being transported by the conveyor 231. For example, the sensor 233 may be mounted on the substrate loading station 201, and the sensor 235 may be mounted on the end effector 225. Other sensor locations may be employed, as may any suitable sensors (e.g., through beam sensors, reflection-based sensors, etc.).

Figure 2B:
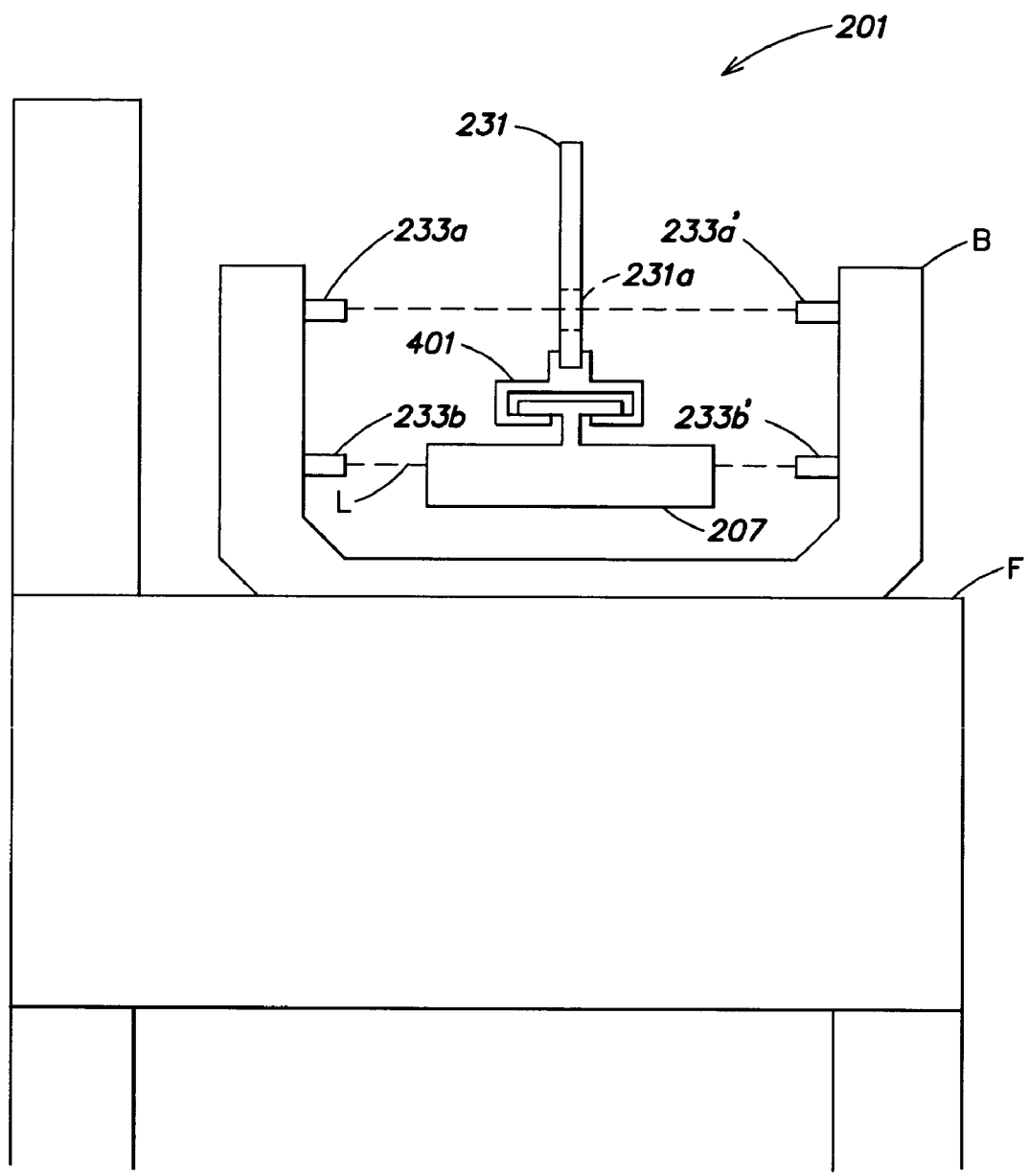
FIG. 2B is a side elevational view of a portion of the substrate loading station of FIG. 2A useful in describing an exemplary embodiment of a first sensor of the substrate loading station.

FIG. 2B is a side elevational view of a portion of the substrate loading station 201 useful in describing an exemplary embodiment of the sensor 233. With reference to FIG. 2B, the sensor 233 comprises a first sensor pair 233a, 233a' for detecting a speed and/or position of the conveyor 231; and/or position of the substrate carrier (and/or the speed with which a substrate carrier 207 is being transported by the conveyor 231 as described further below). The sensor 233 also may include a second sensor pair 233b, 233b' for detecting whether a substrate carrier 207 is being transported by the conveyor 231. For example, the first sensor pair 233a, 233a' may be mounted at an elevation of the conveyor 231 and the second sensor pair 233b, 233b' may be mounted at an elevation at which substrate carriers are transported by the conveyor 231 as shown in FIG. 2B (e.g., via a mounting bracket B coupled to a frame F of the substrate loading station 201, or via another suitable mounting mechanism). Each sensor pair may comprise, for example, a Model No. M126E2LDQ light source and a Model No. Q23SN6RMHSQDP receiver available from Banner, Inc. Other sensor arrangements/types may be employed. Exemplary embodiments for the sensor 235 are described further below with reference to FIGS. 2C–E and FIG. 3.

A controller 237 (FIG. 2A) may be coupled to the sensors 233, 235 and to the substrate carrier handler 215 to receive input from the sensors 233, 235 and to control operation of the substrate carrier handler 215 as described further below. More or fewer than the two sensors 233, 235 may be provided, and the sensors 233, 235 may be mounted at locations other than those shown in FIGS. 2A and 2B. The controller 237 may be the same controller used to control operation of a processing tool that the substrate loading station 201 serves, or a separate controller.

In at least one embodiment of the invention, speed of the conveyor (and/or a substrate carrier being transported by the conveyor) may be directly measured (rather than employing the sensor 233 to indirectly measure conveyor speed). For example, as shown in FIG. 2A, one or more encoders 240a, 240b (described below) may be coupled to the conveyor 231 and directly measure the speed of the conveyor 231 (and any substrate carriers being transported thereby) and provide speed information to the controller 237. More or fewer than two encoders may be employed. Each encoder may comprise, for example, a U.S. Digital encoder (e.g., an HDS6 quadrature encoder) or any other suitable encoder. A linear encoder, resolver or other positioning device also may be employed to measure conveyor speed and/or position.

Figure 3:
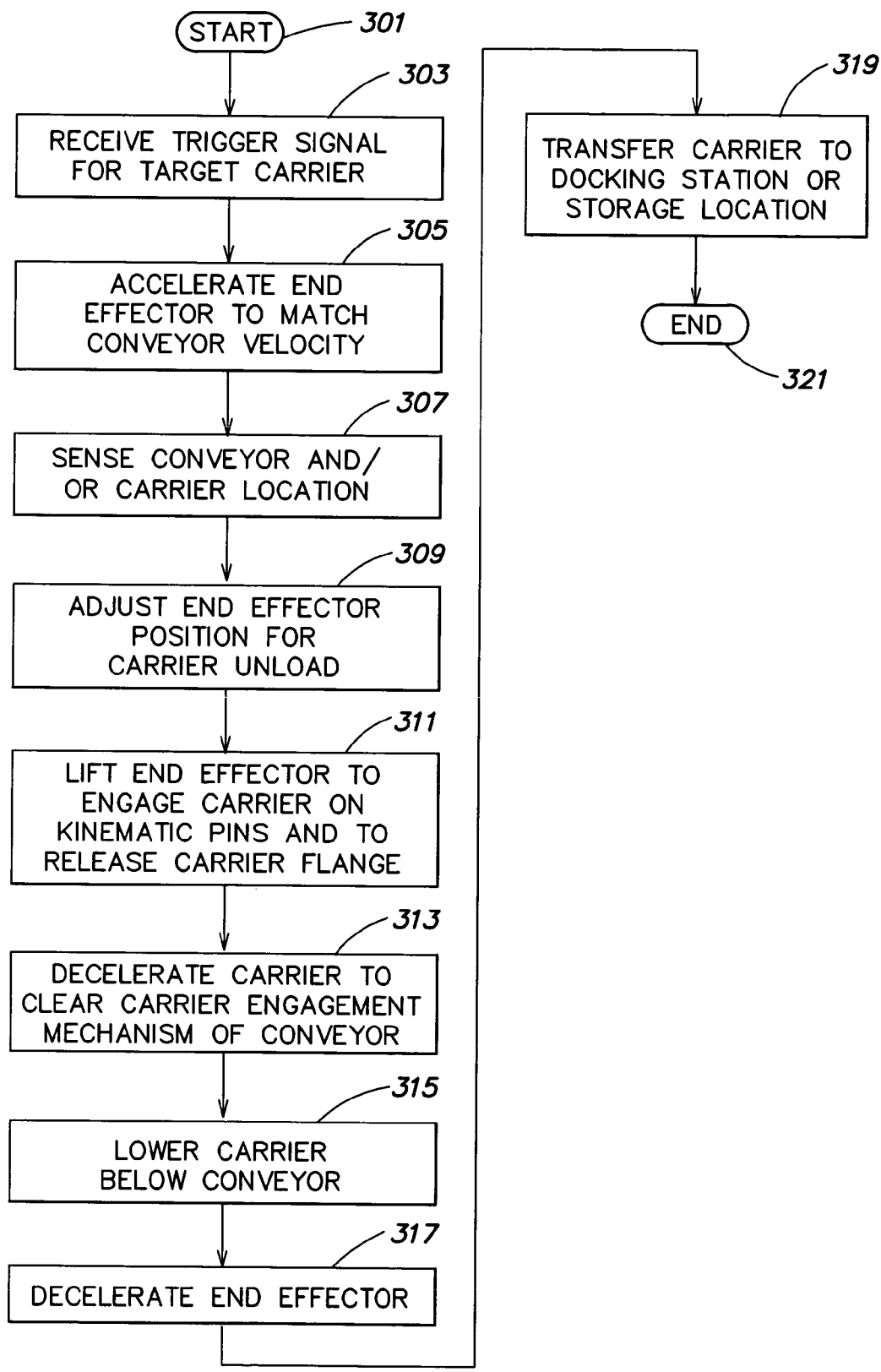
FIG. 3 is a flow chart that illustrates an exemplary process performed in accordance with the invention to unload a substrate carrier from a moving conveyor.

FIG. 3 is a flow chart that illustrates an exemplary process that may be performed by the substrate loading station 201 in accordance with the invention to unload a substrate carrier 207 from the conveyor 231. FIGS. 4A–4E are schematic side views, illustrating stages of the process of FIG. 3.

When an operation for unloading a substrate carrier 207 from the conveyor 231 is to be performed, the horizontal guide 221 of the substrate carrier handler 215 is positioned near the upper ends 217a, 219a of the vertical guides 217, 219, and the support 223 is positioned near the upstream side 221a (in the view of FIG. 2A, the left side although right to left travel may be employed if the conveyor 231 travels right to left) of the horizontal guide 221.

Figure 4A:
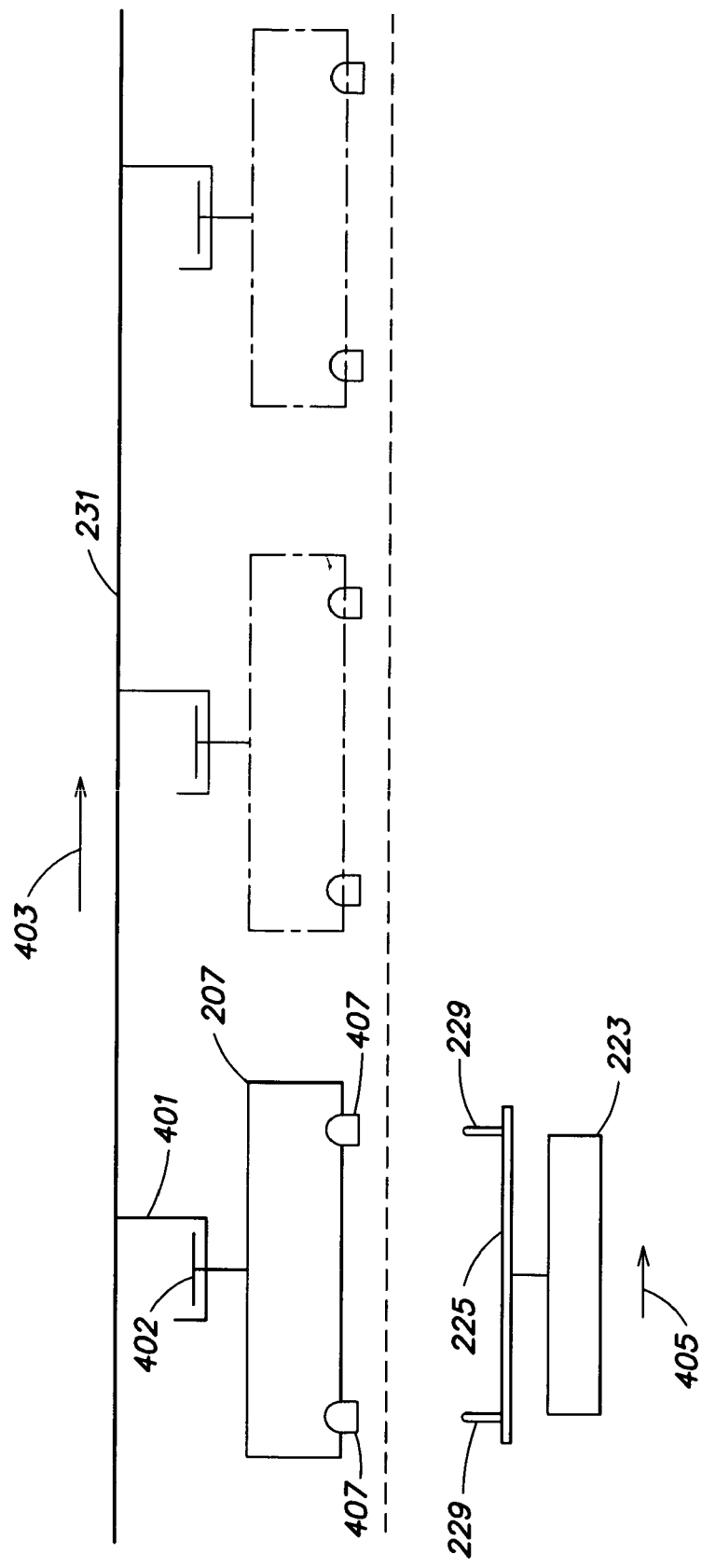
FIGS. 4A–4E are schematic side views showing various stages of the process of FIG. 3.

The process of FIG. 3 starts at step 301 and proceeds to step 303. At step 303 the controller 237 receives a signal (e.g., from the sensor 233 or 235) to indicate the presence of a substrate carrier 207 that is being transported by the conveyor 231 and that is to be unloaded from the conveyor 231 by the substrate loading station 201 (a "target substrate carrier 207"). For example, with reference to FIG. 2B, the sensor pair 233b, 233b' may detect the target substrate carrier 207 as a light beam L associated with the sensor pair 233b, 233b' is blocked by the target substrate carrier 207. Upon receipt of the sensor signal, the controller 237 controls the substrate carrier handler 215 such that the support 223 (with the end effector 225 attached thereto) is accelerated in the same direction of travel as the conveyor 231 (e.g., to the right in FIG. 2A) to substantially match the position and speed of the target substrate carrier 207 (step 305, FIG. 3). FIG. 4A illustrates this stage of the process of FIG. 3.

In at least one embodiment of the invention, prior to accelerating the end effector 225 so that it substantially matches the position and speed of the target substrate carrier 207 (step 305), the controller 237 employs the sensor 233 (or one or more of the encoders 240a, 240b) to determine a speed of the conveyor 231. Position of the conveyor 231 also may be determined. As stated, the sensor 233 may comprise a first sensor pair 233a, 233a' (FIG. 2B) for detecting a speed of the conveyor 231 (and/or the speed with which a substrate carrier 207 is being transported by the conveyor 231), and a second sensor pair 233b, 233b' for detecting whether a substrate carrier 207 is being transported by the conveyor 231. Such a speed and/or position determination may be performed prior to or during the unloading of each target substrate carrier 207, periodically, continuously or at some other interval.

Based on the speed of the conveyor 231, the controller 237 may determine a motion profile for the end effector 225 and direct motion of the end effector 225 in accordance with the motion profile to substantially match the speed and position of the end effector 225 and target substrate carrier 207. The motion profile may be "predetermined", such that the controller 237 only allows the end effector 225 to begin performing an unload operation (e.g., begin accelerating) if the speed of the conveyor 231 is within a predetermined speed range (e.g., a range that ensures that the end effector 225 will be properly aligned with the target substrate carrier 207 if the end effector 225 is accelerated, moved and/or positioned in accordance with the predetermined motion profile); otherwise, the process of FIG. 3 ends. Such a predetermined motion profile may be employed even if the speed of the conveyor 231 is not measured (e.g., assuming the speed of the conveyor 231 is maintained within a predetermined speed range that ensures that the end effector 225 will be properly aligned with the target substrate carrier 207 if the end effector 225 is accelerated in accordance with the predetermined motion profile).

The controller 237 may employ the speed of the conveyor 231 to determine a motion profile for the end effector 225, for example, using a look up table of predetermined motion profiles, using an algorithm to calculate the motion profile, etc. It will be understood that substrate carrier speed, rather than conveyor speed may be measured and employed to determine a motion profile or whether to employ a predetermined motion profile for the end effector 225. Each motion profile may include all of the accelerations, decelerations, raisings and lowerings (described below) employed by the end effector 225 during an unload operation.

As stated, in at least one embodiment of the invention, the conveyor 231 may comprise a ribbon-shaped band (e.g., of stainless steel or another suitable material) as described in previously incorporated U.S. patent application Ser. No. 60/443,087, filed Jan. 27, 2003. In such an embodiment, the conveyor 231 may be provided with slots or other openings (e.g., slot 231a in FIG. 2B) spaced along the conveyor 231 at predetermined spacings, through which a light beam of sensor pair 233a, 233a' (FIG. 2B) may pass as the slots of the conveyor 231 travel by the sensor pair 233a, 233a'. By measuring the time between two successive transmissions of the light beam of sensor pair 233a, 233a' through the conveyor 231 (via two successive slots in the conveyor) and with knowledge of the distance between the two successive slots, the speed of the conveyor 231 may be determined. The position of the slots 231a above each substrate carrier 207 (FIG. 2C) also provide the controller 237 with conveyor 231 and/or substrate carrier 207 position information.

In one more embodiment of the invention, the encoders 240a, 240b (FIG. 2A) may be employed to directly read conveyor speed. For example, each encoder 240a, 240b may provide conveyor speed information to the controller 237 and the controller 237 may compare the information received from the encoders 240a, 240b as part of an error checking or confidence routine. Such speed monitoring may be performed periodically, continuously or at any other interval. By measuring conveyor speed directly (e.g., via one or more encoders or other positioning devices), and by determining band position via the sensor 233 (e.g., and slots 231a) handoffs of substrate carriers between the end effector 225 and the conveyor 231, while the conveyor 231 is in motion, may be precisely performed as described further below.

In FIG. 4A the target substrate carrier 207 is shown being transported by the conveyor 231 by means of a carrier engagement member 401 which engages a top flange 402 of the substrate carrier 207. Other configurations for supporting the substrate carrier 207 may be employed (e.g., one or more mechanisms for supporting the substrate carrier 207 by its sides, bottom or the like). One such configuration for the carrier engagement member 401 is described in previously incorporated U.S. patent application Ser. No. 60/443,153, filed Jan. 27, 2003.

An arrow 403 indicates the direction of motion of the conveyor 231. The end effector 225 of the substrate carrier handler 215 is illustrated in FIG. 4A in a position below the target substrate carrier 207 and being moved (as indicated by an arrow 405) in the same direction as the conveyor 231 at a speed that substantially matches the speed of the target substrate carrier 207. The end effector 225 thereby substantially matches a velocity (e.g., speed and direction) of the target substrate carrier 207. In addition, the end effector 225 substantially matches a position of the target substrate carrier 207. More generally, the end effector 225 substantially matches a motion (velocity and/or position) of the target substrate carrier 207. As used herein, "substantially matches" means sufficiently matches so that a substrate carrier may be unloaded from and/or loaded onto a moving conveyor and/or carrier engagement member without damaging a substrate contained within the substrate carrier and/or generating potentially damaging particles.

In the embodiment shown in FIG. 4A, the target substrate carrier 207 moves with the conveyor 231. Accordingly, the end effector 225 also substantially matches the speed, velocity, motion and/or position of the conveyor 231. There may be embodiments in which the conveyor 231 moves at a different rate, or not at all, relative to the target substrate carrier 207. For example, the carrier engagement member 401 itself may move the target substrate carrier 207 along the conveyor 231. In this later embodiment, the end effector 225 may not substantially match the speed, velocity and/or position of the conveyor 231.

In one or more embodiments of the invention, the end effector 225 may not be positioned at the same location as the trigger (or launch) sensor (e.g., sensor pair 233b, 233b' of FIG. 2B) that detects the presence of the target substrate carrier 207 on the conveyor 231. In such instances, it may be necessary to delay acceleration of the end effector 225 in step 305 to compensate for the differing positions of the end effector 225 and the trigger sensor. This "launch offset" may depend on, for example, the distance between the end effector 225 and the trigger sensor, the speed of the conveyor 231, etc. A launch offset may be separate from or built into a motion profile for the end effector 225.

Figure 2C:
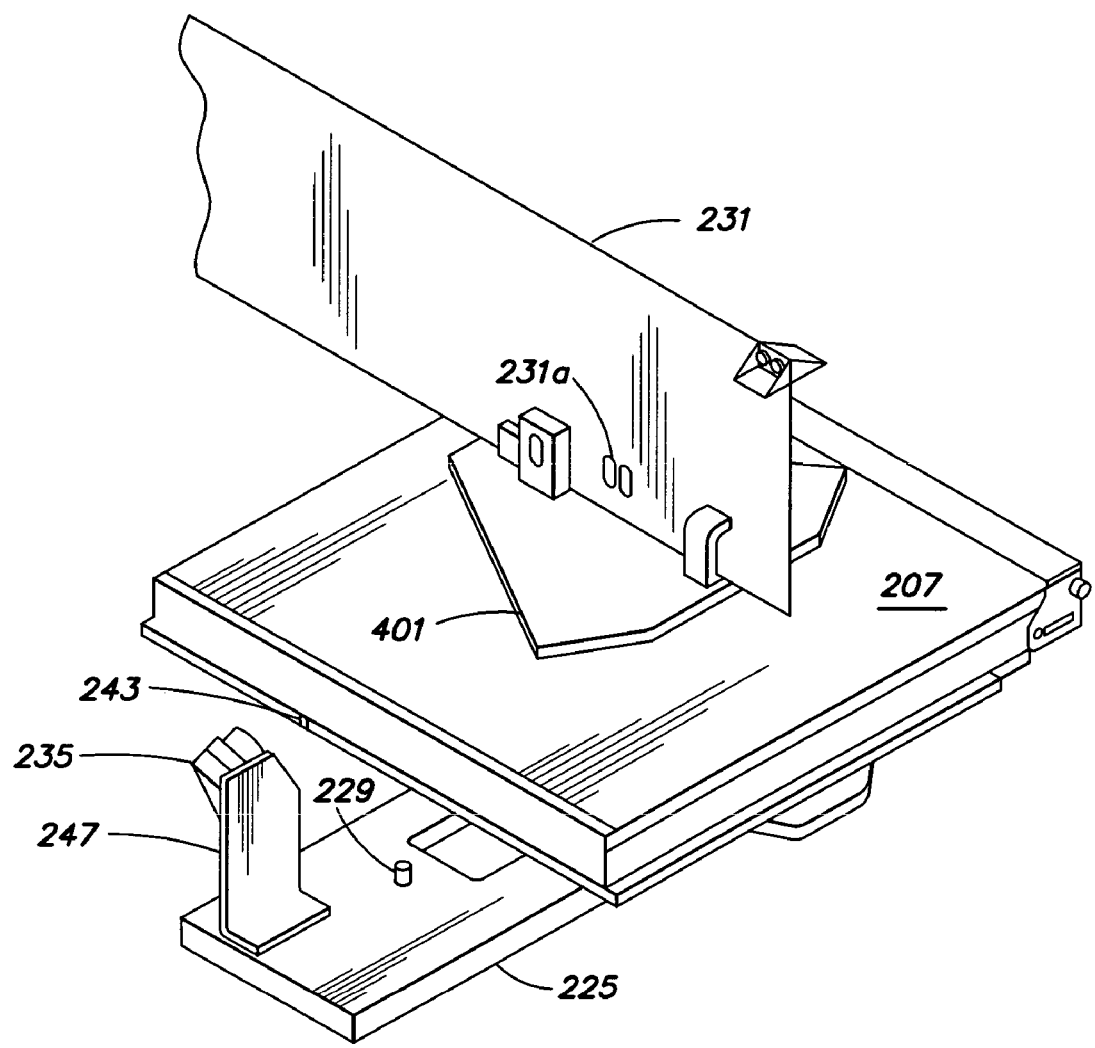
FIG. 2C is a perspective view of a portion of the end effector of FIG. 2A illustrating an exemplary second sensor of the substrate loading station of FIG. 2A.
Figure 2D:
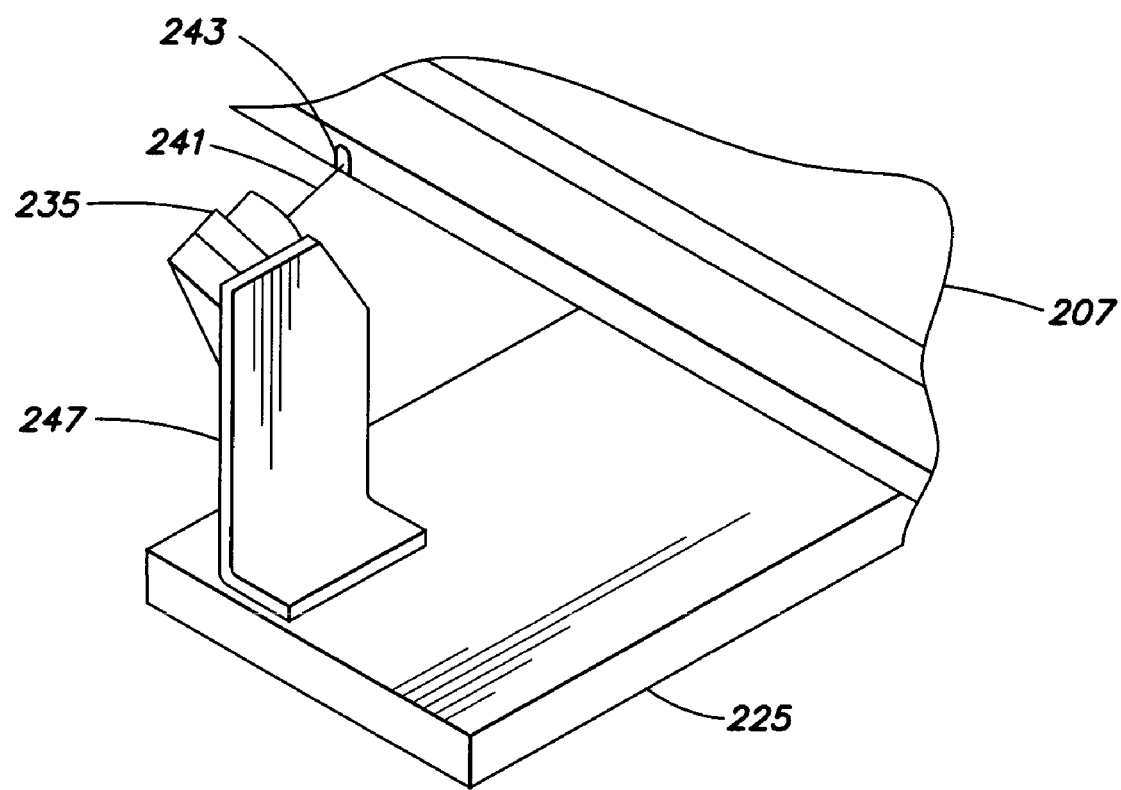
FIG. 2D is an enlarged perspective view of a portion of FIG. 2C.

Referring again to FIG. 3, at step 307, the position of the target substrate carrier 207 relative to the end effector 225 is detected (e.g., via a signal or signals from the sensor 235 (FIG. 2A)). For example, if the sensor 235 comprises a light source/detector pair, such as a Model No. QS30 sensor system available from Banner, Inc. or the like, the sensor 235 may emit a beam of light toward the target substrate carrier 207 that is only detected by the sensor 235 if the end effector 225 is properly positioned relative to the target substrate carrier 207 (e.g., by providing the substrate carrier 207 with an appropriate reflective surface and/or surface topography such as an angled notch that reflects light toward the sensor 235 only when the end effector 225 is properly positioned relative to the substrate carrier 207). FIG. 2C is a perspective view of a portion of the end effector 225 illustrating an exemplary sensor 235 positioned to detect a light beam 241 (FIG. 2D) reflected from a notch 243 formed in a portion of a target substrate carrier 207 when the end effector 225 is properly positioned relative to the target substrate carrier 207. FIG. 2D is an enlarged perspective view of a portion of FIG. 2C. As shown in FIGS. 2C–2D, the sensor 235 may be coupled to the end effector 225 via a suitable bracket or other support structure 247. Other configurations may be employed.

In at least one embodiment of the invention, if the end effector 225 is not properly positioned relative to the target substrate carrier 207, then the process of FIG. 3 ends. Alternatively, in another embodiment of the invention, any necessary adjustments in the position of the end effector 225 relative to the target substrate carrier 207 may be made (step 309). For example, the controller 237 may accelerate and/or decelerate the end effector 225 until a proper alignment signal is received from the sensor 235 so as to ensure that kinematic pins 229 (FIG. 4A) are properly positioned below alignment features (e.g., concave or otherwise-shaped features 407) of the target substrate carrier 207. It will be appreciated that the steps 307 and 309 are performed while the target substrate carrier 207 and the end effector 225 are in motion, and are performed so that the end effector 225 is positioned below the target substrate carrier 207 while substantially matching speed therewith. Accordingly, the end effector 225 is moved so as to remain adjacent and below the target substrate carrier 207 while the target substrate carrier 207 is in motion. It will be understood that the relative position of the target substrate carrier 207 and the end effector 225 may be detected and adjusted numerous times (or continuously), and that a feedback control loop (not shown) may be employed to ensure that the speed and/or position of the end effector 225 remain substantially matched with that of the target substrate carrier 207. In yet another embodiment of the invention, steps 307 and 309 may be eliminated (e.g., if a predetermined motion profile is employed that is correlated to the speed of the conveyor 231 and launch time/position of the end effector 225). In such an embodiment, the sensor 235 may be eliminated.

In place of or in addition to the sensor 235, the encoder 240a and/or 240b may be employed to monitor conveyor speed during an unload operation. In response to gross deviations in conveyor speed during an unload operation, the controller 237 may abort the unload operation (e.g., by employing another motion profile that ensures that the end effector 225 does not interfere with the conveyor 231 or substrate carriers being transported thereby). Alternatively, for small conveyor speed variations, the controller 237 may adjust end effector position (e.g., via accelerations or decelerations) to ensure proper unload (or load) operations. A closed loop system comprising the end effector 225, the sensor 233, the encoders 240a and/or 240b and/or the controller 237 thereby may ensure proper unload (or load) operations despite conveyor speed variations.

Figure 4B:
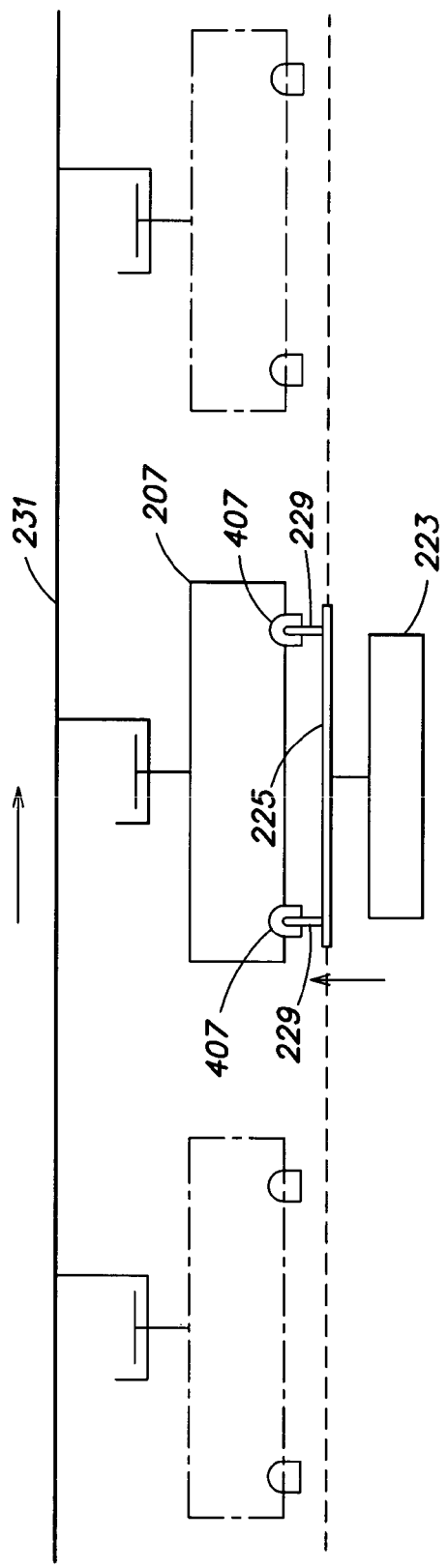
Figure 4C:
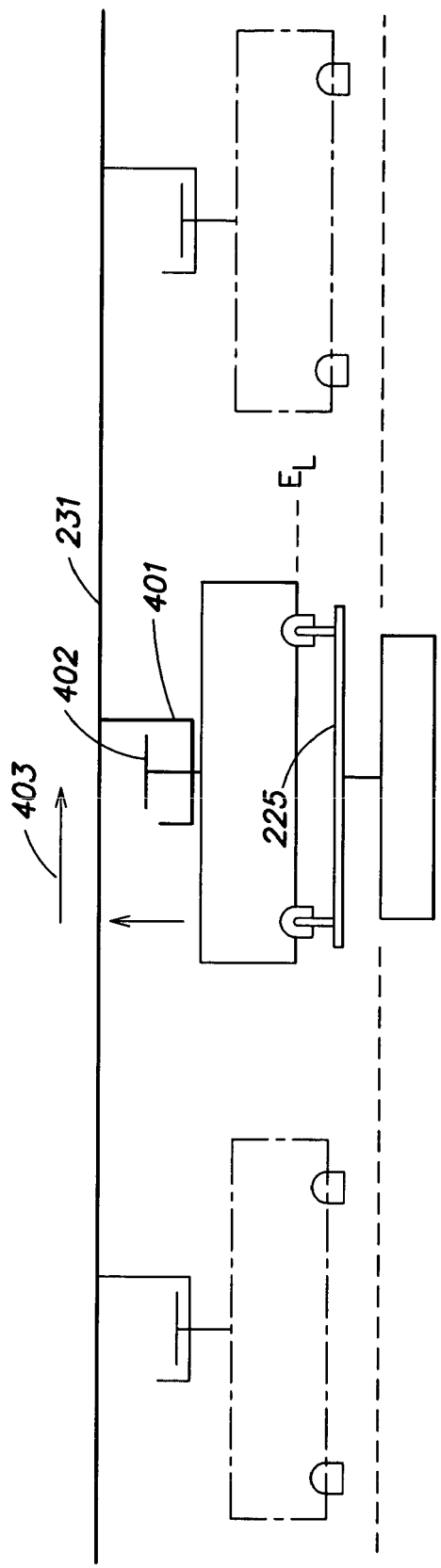

Assuming the end effector 225 is properly positioned relative to the target substrate carrier 207, following step 307 and/or step 309 in the process of FIG. 3 is step 311. At step 311, the controller 237 controls the substrate carrier handler 215 such that the end effector 225 is raised (e.g., the horizontal guide 221 is raised on the vertical guides 217, 219 to raise the end effector 225) while continuing to substantially match the horizontal speed (and/or instantaneous position) of the end effector 225 to the speed (and/or instantaneous position) of the target substrate carrier 207. The raising of the end effector 225 causes the kinematic pins 229 thereof to come into engagement with concave features 407 on the bottom of the target substrate carrier 207. Thus the end effector 225 is moved to an elevation at which the conveyor 231 transports substrate carriers 207. In this manner, the end effector 225 contacts the bottom of the target substrate carrier 207 (as shown in FIG. 4B). In one or more embodiments of the invention, the end effector 225 preferably contacts the target substrate carrier 207 with substantially zero velocity and/or acceleration as described further below with reference to FIGS. 8A–D. As the end effector 225 continues to be raised (while the end effector continues to substantially match horizontal speed and/or position with the target substrate carrier 207), the target substrate carrier 207 (and in particular its top flange 402) is lifted out of engagement with the carrier engagement member 401 of the conveyor 231, as illustrated in FIG. 4C.

Figure 4D:
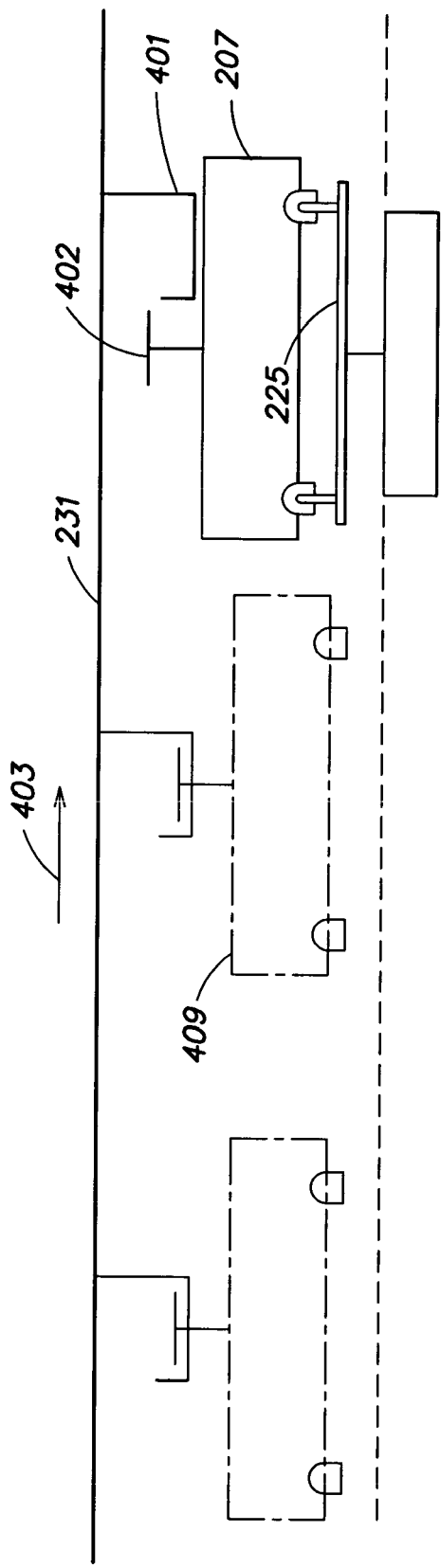

Next, in step 313 of FIG. 3, the controller 237 controls the substrate carrier handler 215 to decelerate horizontal motion of the end effector 225 slightly, thereby decelerating the target substrate carrier 207. The degree of deceleration is such that the target substrate carrier 207 continues to move in the direction indicated by the arrow 403, but at a slower speed than the conveyor 231. This allows the carrier engagement member 401 (which had engaged the flange 402 of the target substrate carrier 207) to move ahead of the flange 402, as indicated in FIG. 4D. Once the carrier engagement member 401 has moved out from underneath the flange 402 (as shown in FIG. 4D), the end effector 225 may be accelerated again, so that the horizontal speed of the end effector 225 and the target substrate carrier 207 supported thereon again substantially matches the horizontal speed of the conveyor 231 to prevent another substrate carrier being transported by the conveyor 231 (e.g., substrate carrier 409 in FIG. 4D) from colliding with the target substrate carrier 207.

Figure 4E:
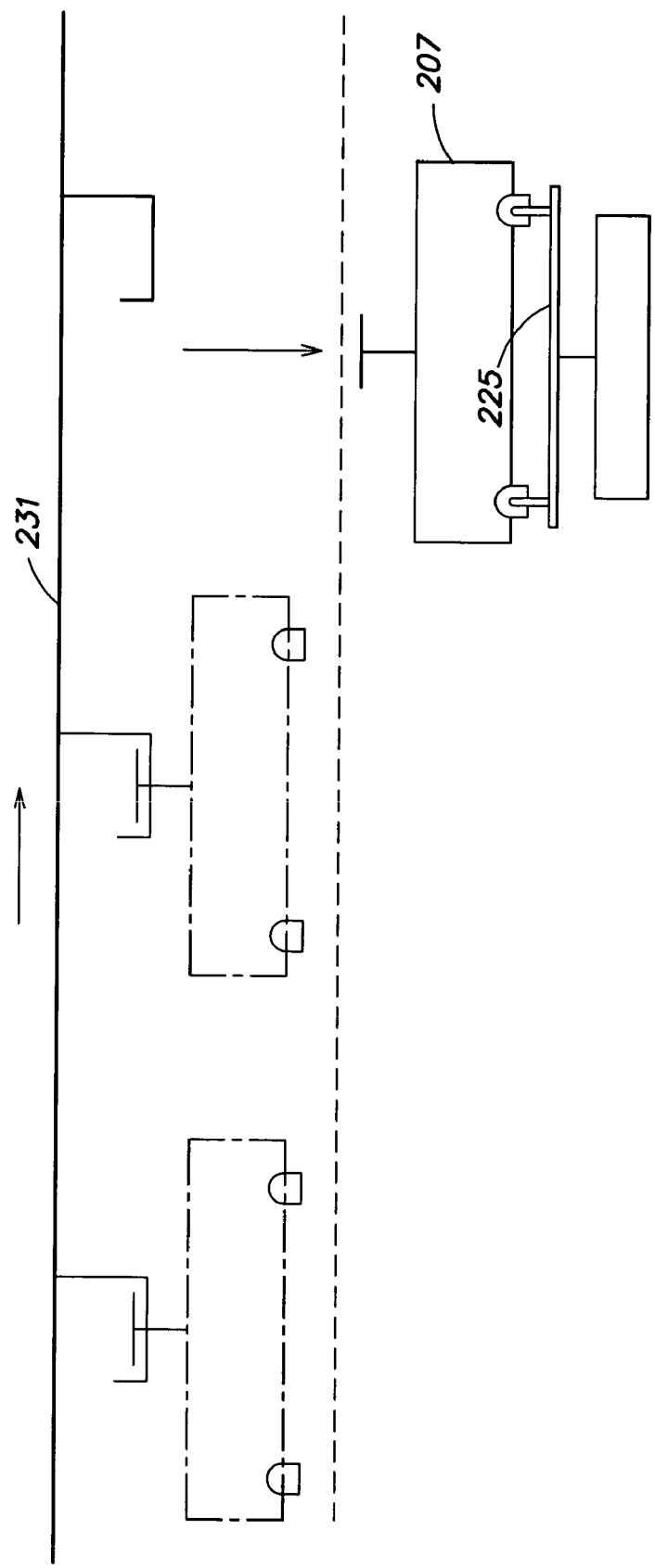

In step 315 in FIG. 3, the end effector 225 is lowered (e.g., by lowering the horizontal guide 221 along the vertical guides 217, 219) to lower the target substrate carrier 207 away from the conveyor 231. The lowering of the target substrate carrier 207 is illustrated in FIG. 4E. The end effector 225, having the target substrate carrier 207 supported thereon, may then be decelerated (step 317, FIG. 3) and brought to a halt. As stated, in at least one embodiment of the invention, the above-described end effector 225 accelerations, decelerations, raisings and/or lowerings may be defined by the motion profile determined for the end effector 225. (Exemplary motion profiles are described below with reference to FIGS. 8A–8D).

In step 319, the substrate carrier handler 215 may transport the target substrate carrier 207 supported on the end effector 225 to one of the docking stations 203 (FIG. 2A). Alternatively, if the loading station 201 includes one or more storage shelves or other storage locations (e.g., storage shelf 239, shown in phantom in FIG. 2A, and adapted to store a substrate carrier), the substrate carrier handler 215 may transport the target substrate carrier 207 to one of the storage locations. (Other and/or more storage locations may be employed). The process of FIG. 3 then ends in step 321.

Assuming that the target substrate carrier 207 is brought to one of the docking stations 203, the target substrate carrier 207 may be handed off by the substrate carrier handler 215 to the docking gripper 211 of the respective docking station 203. The target substrate carrier 207 then may be docked at the docking station 203, and opened by the substrate carrier opener 213 of the docking station 203 to allow extraction of a target substrate from the target substrate carrier 207 (e.g., by a substrate handler such as the FI robot 119 of FIG. 1). The extracted substrate may be transferred to a processing tool associated with the substrate loading station 201 (e.g., the processing tool 113 of FIG. 1) and one or more fabrication processes may be applied to the substrate by the processing tool. Upon completion of the processing in the processing tool, the substrate may be returned to the target substrate carrier 207 at the docking station 203 and the target substrate carrier 207 may be closed and undocked from the docking station 203. The substrate carrier handler 215 then may transport the target substrate carrier 207 away from the docking station 203 and to a position just below the conveyor 231 (e.g., assuming the substrate carrier 207 is to be returned to the conveyor 231 rather than stored at a storage location such as the storage location 239). That is, with the substrate carrier 207 supported on the end effector 225, the horizontal guide 221 may be moved near the upper ends 217*a*, 219*a* of the vertical guides 217, 219, and the support 223 may be moved to the upstream end 221*a* of the horizontal guide 221. The substrate carrier 207 then may be transferred back onto the conveyor 231 as described below with reference to FIGS. 5–6E.

Figure 5:
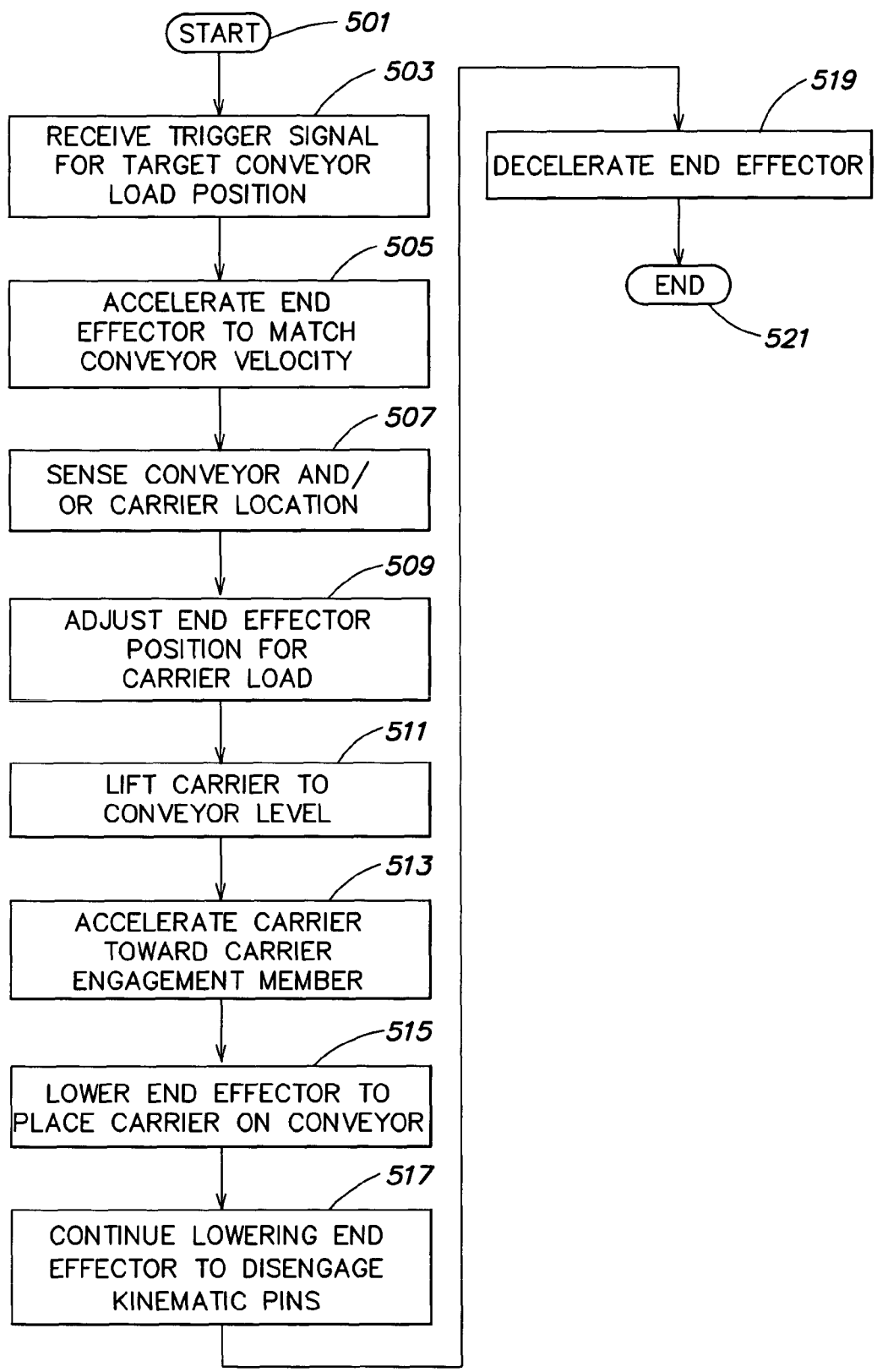
FIG. 5 is a flow chart that illustrates an exemplary process performed in accordance with the invention to load a substrate carrier onto a moving conveyor.

An exemplary process that may be performed in accordance with the invention for loading a target substrate carrier 207 onto the conveyor 231 will now be described with reference to FIGS. 5–6E. FIG. 5 is a flow chart that illustrates the inventive substrate carrier loading process. FIGS. 6A–6E are schematic side views showing various stages of the process of FIG. 5.

The process of FIG. 5 starts at step 501 and continues with step 503. At step 503 the controller 237 receives a signal (e.g., from the sensor 233 or 235) indicating the presence of a vacant carrier engagement member 401 of the conveyor 231. In response to this signal, in step 505, the controller 237 controls the substrate carrier handler 215 so that the end effector 225 (with the target substrate carrier 207 to be transferred to the conveyor 231 thereon) is accelerated along the horizontal guide 221 to substantially match the motion of the vacant carrier engagement member 401 (and/or the conveyor 231). For example, the end effector 225 may substantially match the speed and position of the vacant carrier engagement member 401 in the horizontal direction. As stated previously, in one or more embodiments, the end effector 225 may not be positioned at the same location as the trigger sensor (e.g., sensor pair 233*b*, 233*b*' of FIG. 2B). In such instances it may be necessary to delay acceleration of the end effector 225 in step 505 to compensate for the differing positions of the end effector 225 and the trigger (or launch) sensor.

In at least one embodiment of the invention, prior to accelerating the end effector 225 so that it substantially matches the position and speed of the vacant carrier engagement member 401 (step 505), the controller 237 employs the sensor 233 or one or more encoders 240*a*, 240*b* coupled to the conveyor 231 to determine a speed of the conveyor 231. Position of the conveyor 231 also may be determined. Based on the speed of the conveyor 231, the controller 237 may determine a motion profile for the end effector 225 and direct motion of the end effector 225 in accordance with the motion profile to substantially match the speed and position of the end effector 225 (with the target substrate carrier 207 thereon) to the vacant carrier engagement member 401 onto which the target substrate carrier 207 is to be loaded. The motion profile may be "predetermined", such that the controller 237 only allows the end effector 225 to begin performing a load operation (e.g., begin accelerating) if the speed of the conveyor 231 is within a predetermined speed range (e.g., a range that ensures that the end effector 225 will be properly aligned with the vacant carrier engagement member 401 if the end effector 225 is accelerated in accordance with the predetermined motion profile); otherwise, the process of FIG. 5 ends.

Alternatively, the controller 237 may employ the speed of the conveyor 231 to determine a motion profile for the end effector 225, for example, using a look up table of predetermined motion profiles, using an algorithm to calculate the motion profile, etc. It will be understood that carrier engagement member speed, rather than conveyor speed may be measured and employed to determine a motion profile or whether to employ a predetermined motion profile for the end effector 225. Each motion profile may include all of the accelerations, decelerations, raisings and lowerings (described below) employed by the end effector 225 during a load operation. (Exemplary motion profiles are described below with reference to FIGS. 8A–8D).

Figure 6A:
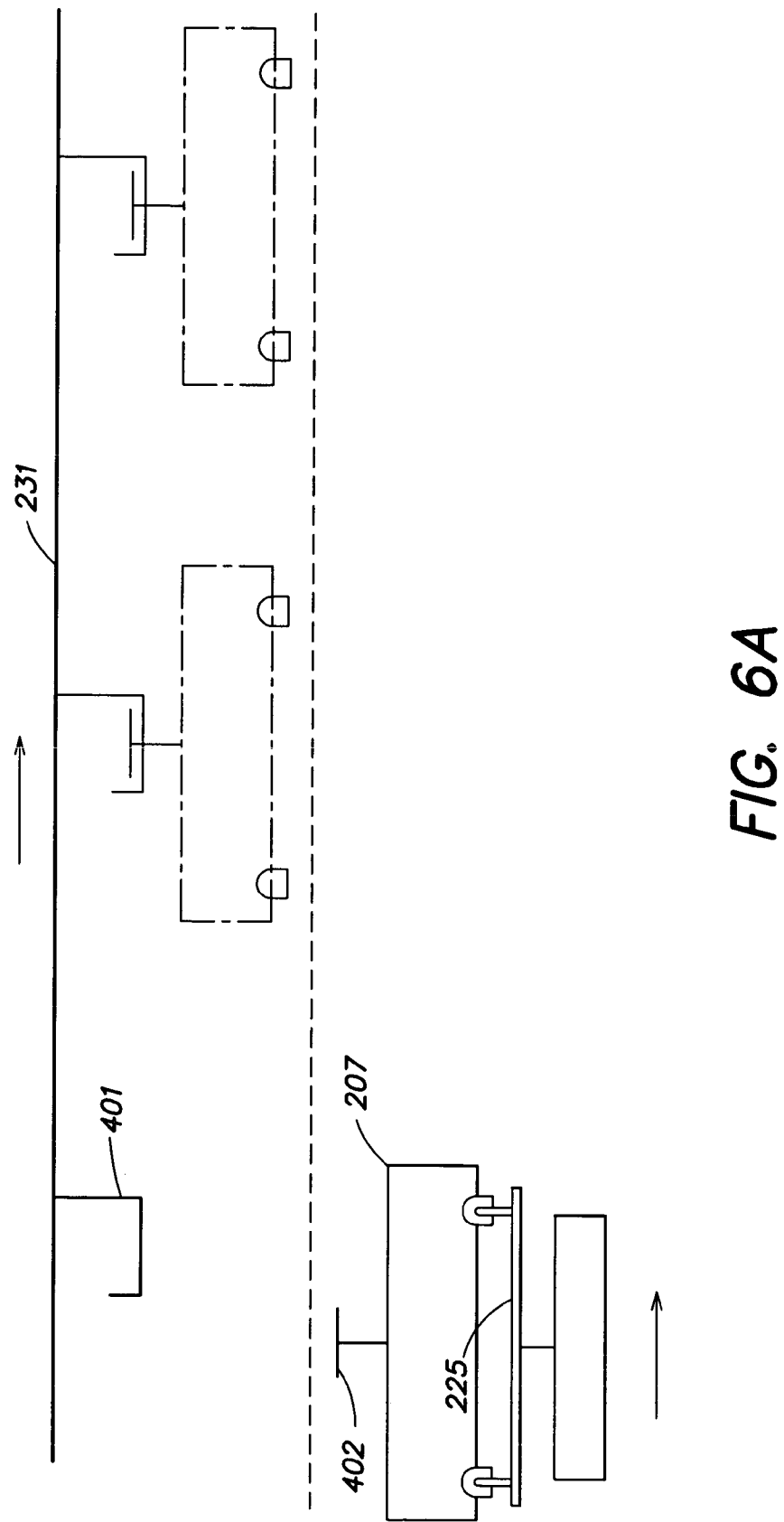
FIGS. 6A–6E are schematic side views showing various stages of the process of FIG. 5.

FIG. 6A shows the end effector 225 being moved at a substantially matching velocity with the conveyor 231, and with the flange 402 of the target substrate carrier 207 below and slightly behind the carrier engagement member 401 on which the target substrate carrier 207 is to be loaded. In this manner, the target substrate carrier 207 may be raised without the flange 402 being obstructed by the carrier engagement member 401 during transfer of the target substrate carrier 207 to the conveyor 231 as described below. In general, the flange 402 of the target substrate carrier 207 may be positioned at any location that allows the target substrate carrier 207 to be raised without contacting the carrier engagement member 401 on which the target substrate carrier 207 is to be loaded and the carrier engagement member (and/or a substrate carrier positioned thereon) that follows the carrier engagement member 401 on which the target substrate carrier 207 is to be loaded.

Following step 505 is step 507 at which the relative horizontal positioning of the target substrate carrier 207 and the carrier engagement member 401 are sensed (e.g., by the sensor 235, FIG. 2A). For example, if the sensor 235 comprises a light source/detector pair, the sensor 235 may emit a beam of light toward the vacant carrier engagement member 401 (or the conveyor 231) that is only detected by the sensor 235 if the end effector 225 is properly positioned relative to the vacant carrier engagement member 401 (as described previously with reference to FIGS. 2C–2D).

Figure 2E:
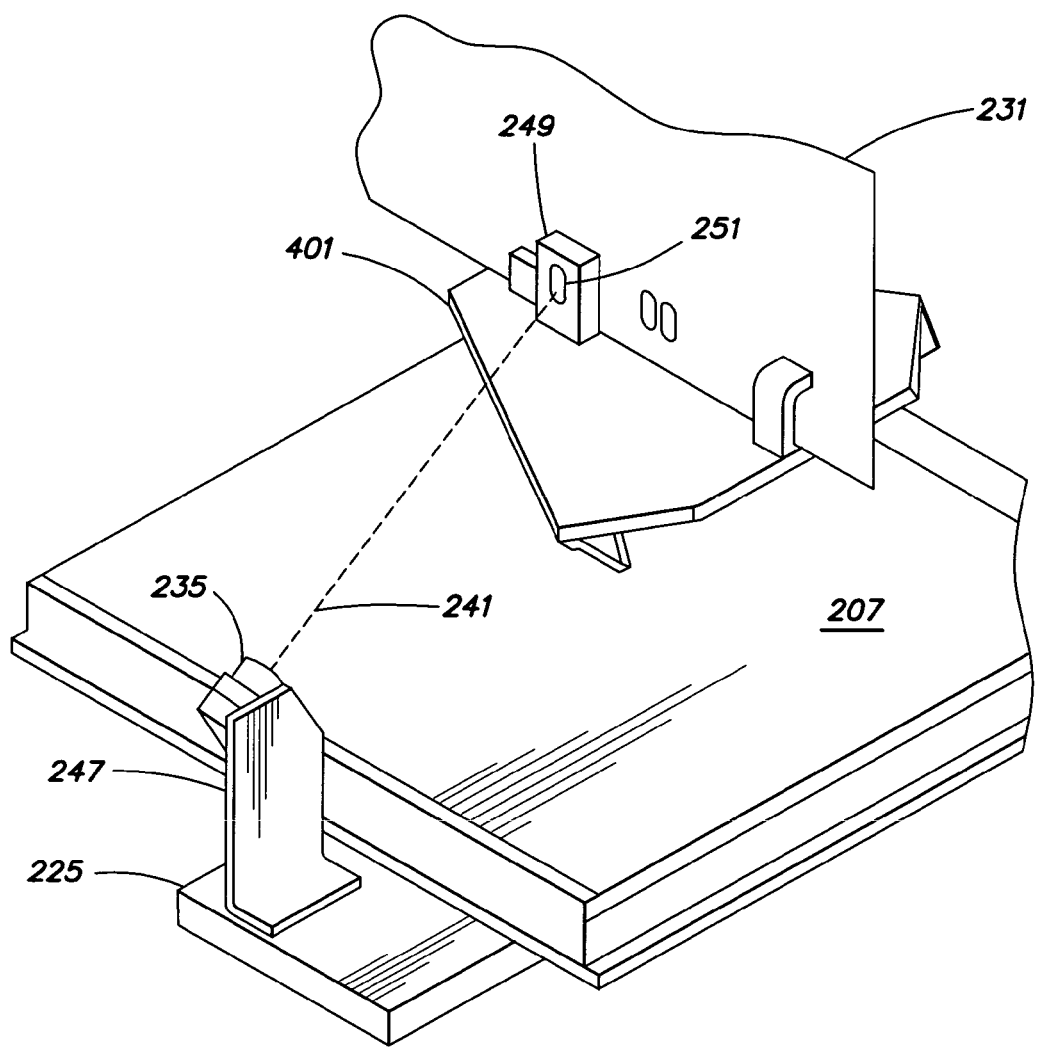
FIG. 2E is a perspective view of a portion of the end effector of FIG. 2A illustrating the second sensor positioned to detect a portion of a carrier engagement member.

FIG. 2E is a perspective view of a portion of the end effector 225 illustrating the sensor 235 positioned to detect a portion 249 of a carrier engagement member 401 that couples the carrier engagement member 401 to the conveyor 231. Specifically, the portion 249 of the carrier engagement member 401 comprises a notch 251 that is angled to reflect light beam 241 (emitted by the sensor 235) back toward the sensor 235 when the end effector 225 is properly positioned below the carrier engagement member 401 for a load operation. Other configurations may be employed. For example, the one or more encoders 240*a*, 240*b* or other positioning devices that directly measure conveyor speed may provide such information to the controller 237 (e.g., continuously) such that the controller 237 may track conveyor position during a load (or unload) operation.

In at least one embodiment of the invention, if the end effector 225 is not properly positioned relative to the vacant carrier engagement member 401, then the process of FIG. 5 ends. Alternatively, in another embodiment of the invention, in step 509 any necessary adjustments may be made in the relative horizontal positioning of the target substrate carrier 207 and the carrier engagement member 401 (e.g., to ensure that the flange 402 does not contact the carrier engagement member 401 when the target substrate carrier 207 is raised as described below). For example, the controller 237 may accelerate and/or decelerate the end effector 225 until a proper alignment signal is received from the sensor 235. During such position adjustment, the horizontal speed of the target substrate carrier 207 and the horizontal speed of the conveyor 231 and/or the carrier engagement member 401 may remain substantially matched. In yet another embodiment of the invention, steps 507 and 509 may be eliminated (e.g., if a predetermined motion profile is employed that is correlated to the speed of the conveyor 231 and/or launch time/position of the end effector 225). In such an embodiment, the sensor 235 may be eliminated.

Figure 6B:
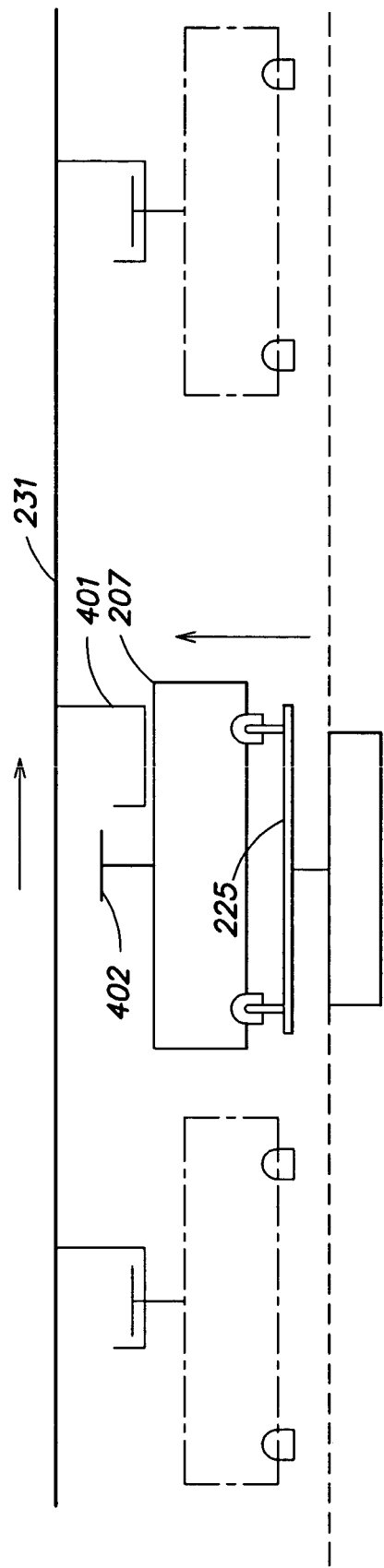

Assuming the end effector 225 is properly positioned relative to the vacant carrier engagement member 401, in step 511, and shown in FIG. 6B, the end effector 225 is raised, by raising the horizontal guide 221 along the vertical guides 217, 219 (FIG. 2A), so that the target substrate carrier 207 and particularly its flange 402, are brought up to the level of the carrier engagement member 401. As shown in FIG. 6B, the flange 402 is positioned slightly above the carrier engagement member 401 (e.g., for loading thereon as described below).

Figure 6C:
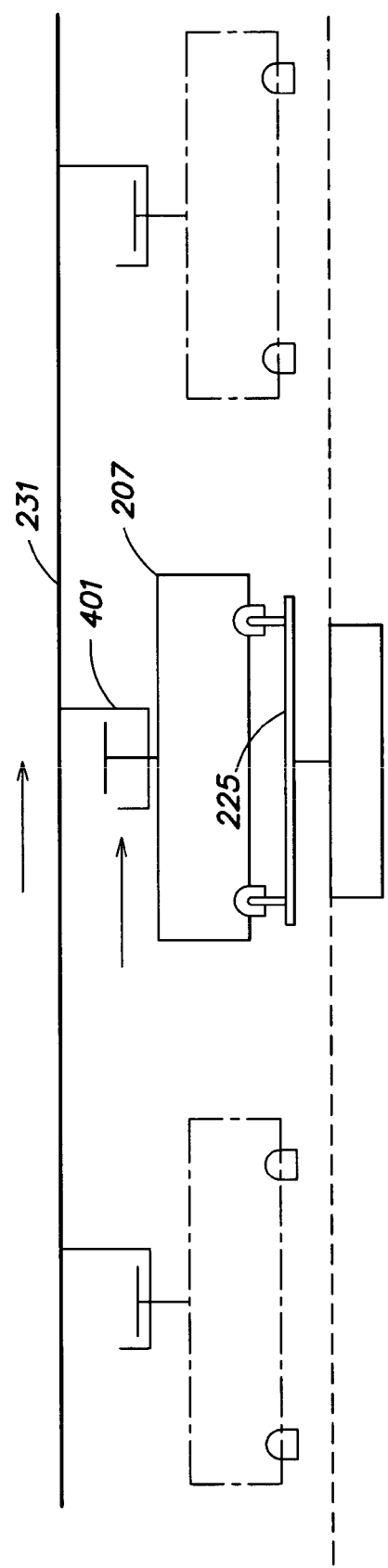
Figure 6D:
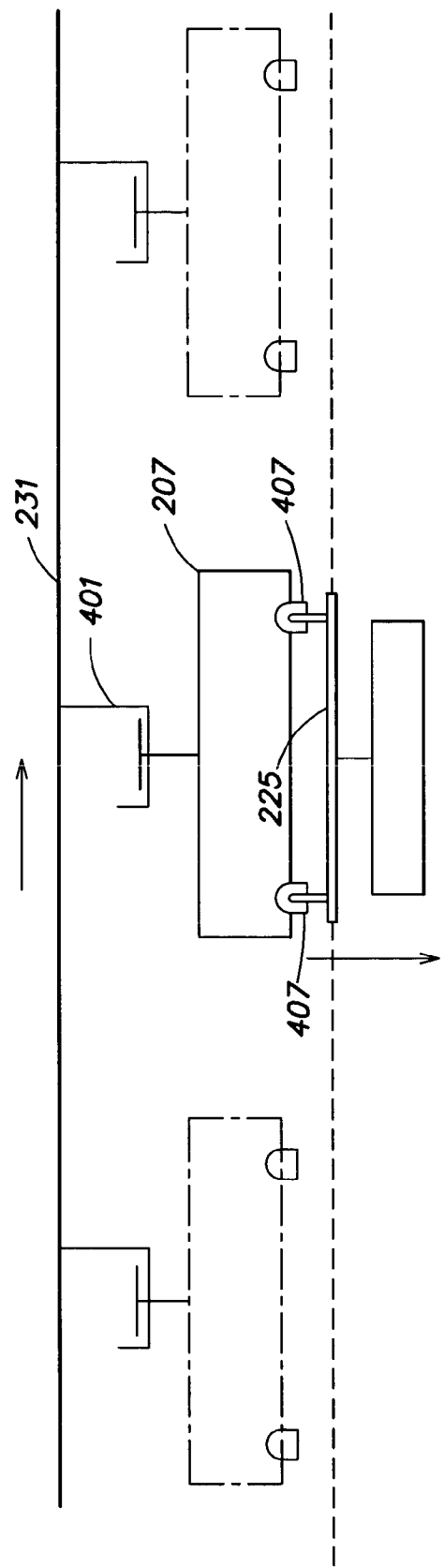
Figure 6E:
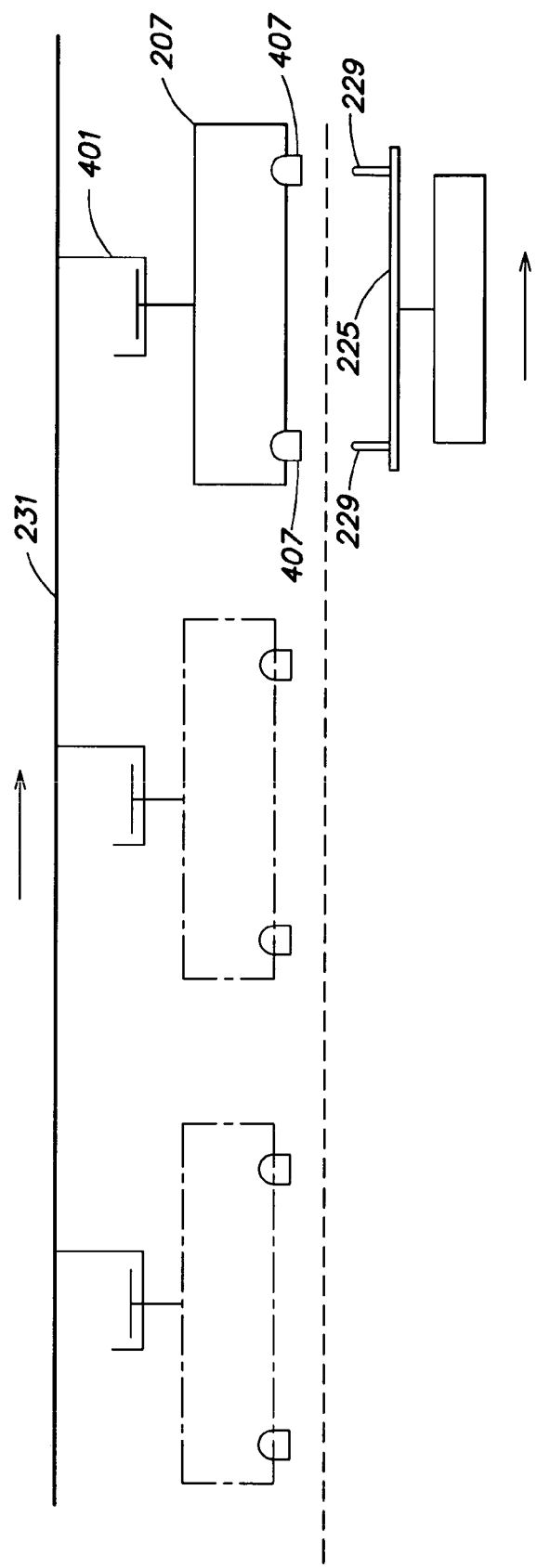

Next, as represented by step 513 and shown in FIG. 6C, the target substrate carrier 207 is accelerated to bring the flange 402 of the target substrate carrier 207 above the carrier engagement member 401 of the conveyor 231. The target substrate carrier 207 is then decelerated, so that the horizontal speed of the target substrate carrier 207 again substantially matches the horizontal speed of the conveyor 231. Next, as illustrated in FIG. 6D and represented by step 515, the end effector 225 is lowered (while continuing to substantially match the horizontal speed of the conveyor 231), to bring the flange 402 of the target substrate carrier 207 into engagement with the carrier engagement member 401 of the conveyor 231, thereby handing off the target substrate carrier 207 to the carrier engagement member 401. In one or more embodiments of the invention, the target substrate carrier 207 preferably contacts the carrier engagement member 401 with substantially zero velocity and/or acceleration as described further below with reference to FIGS. 8A–8B. The substrate carrier handler 215, under control of the controller 237, continues to lower the end effector 225, (e.g., while continuing to substantially match the horizontal speed of the conveyor 231), so that the kinematic pins 229 of the end effector 225 are disengaged from the features 407 on the bottom of the target substrate carrier 207. An exemplary result of step 517 is illustrated in FIG. 6E.

After the end effector 225 is disengaged from the target substrate carrier 207, in step 519 the end effector 225 is decelerated (e.g., halted) and the process of FIG. 5 ends (step 521). Meanwhile, the target substrate carrier 207, which is supported via its flange 402 by the carrier engagement member 401 of the conveyor 231, is transported away from the loading station 201 by the conveyor 231. As stated, in at least one embodiment of the invention, the above-described end effector 225 accelerations, decelerations, raisings and/or lowerings may be defined by the motion profile determined for the end effector 225.

Thus the substrate loading station 201 provided in accordance with the invention, and in particular the substrate carrier handler 215 operating under the control of the controller 237, functions to unload substrate carriers from a moving conveyor and to load substrate carriers onto the moving conveyor. In this manner, the inventive substrate loading station and substrate carrier handler may reduce substrate dwell time within a fabrication facility, work-in-progress, and working capital and manufacturing costs.

In accordance with the invention, the controller 237 may be programmed to perform one or both of the processes of FIGS. 3 and 5. Also the processes of FIGS. 3 and 5 may be embodied in one or more computer program products. Each computer program product may be carried by a medium readable by a computer (e.g., a carrier wave signal, a floppy disk, a hard drive, a random access memory, etc.).

In at least one embodiment of the invention, the inventive substrate loading station 201 may be configured to automatically retract the end effector 225 away from the conveyor 231 in the event of a power failure, emergency shutdown, etc. For example, the controller 237 may include an end effector retraction routine which automatically retracts the end effector 225 (and/or the horizontal guide 221) away from the conveyor 231 in response to a predetermined interrupt such as a power failure, emergency shutdown, or the like. Further, the end effector 225 (and/or the horizontal guide 221) may be biased so that the end effector 225 (and/or the horizontal guide 221) automatically retracts when power is removed from the substrate loading station 201. Any suitable biasing mechanism such as springs, gravity, air cylinders, ball screws, lead screws, etc., may be employed. The above mentioned end effector retraction routine may be implemented, for example, as one or more computer program products.

Exemplary parameters that may affect design of the substrate loading station 201 include, for example, (1) conveyor speed; (2) horizontal and/or vertical speed at which the substrate carrier handler 215 can move the end effector 225; (2) horizontal and/or vertical acceleration and deceleration that may be applied to the end effector 225 of the substrate carrier handler 215; (4) horizontal and vertical range of movement of the end effector 225 of the substrate carrier handler 215; (5) distance between adjacent substrate carriers 207 transported by the conveyor 231; (6) elevation at which the conveyor 231 transports the substrate carriers 207; (7) vertical distance a substrate carrier 207 should be lifted to clear the carrier engagement member 401 of the conveyor 231 used to transport the substrate carrier 207; (8) height (e.g., vertical dimension) of each substrate carrier 207; (9) distance a substrate carrier 207 must be lowered, after being released from a carrier engagement member 401, to allow substrate carriers being transported by the conveyor 231 to pass over the released substrate carrier 207 without striking the released substrate carrier 207; (10) the type of carrier engagement member employed; and/or (11) other similar parameters.

For example, in at least one embodiment of the invention, the inventive substrate carrier handler 215 should be capable of (1) achieving a maximum horizontal speed for the end effector 225 that is greater than or equal to the horizontal speed of the conveyor 231; (2) raising the end effector 225 to an elevation sufficient to disengage and clear a substrate carrier 207 from a conveyor carrier engagement member 401; (3) moving at two or more horizontal speeds, such as a first horizontal speed for matching conveyor speed and a second horizontal speed for transporting a substrate carrier 207 to and from a docking station 203; (4) moving at two or more vertical speeds, such as a first vertical speed for disengaging a substrate carrier 207 from or handing off a substrate carrier 207 to the conveyor 231, and a second vertical speed for transporting a substrate carrier 207 to and from a docking station 203; and/or (5) performing all accelerations and decelerations of a substrate carrier 207 supported by the end effector 225 (and required for substrate carrier engagement with or disengagement from the conveyor 231) without damaging a substrate or substrates contained in the substrate carrier 207.

Likewise, the substrate carrier handler 215 should operate so as to lower its end effector 225 to a sufficiently low level to service the lowest docking station 203. (If a storage shelf or other storage location is present that is lower than the lowest docking station 203, then the substrate carrier handler 215 should be further operative to lower the end effector 225 to service the lowest storage shelf/location). The horizontal range of travel for the end effector 225 provided on the horizontal guide 221, and the mechanism for moving the end effector 225 should be such that the end effector 225 is able to accelerate to a horizontal speed substantially matching conveyor speed, disengage a substrate carrier 207 from and/or engage a substrate carrier 207 with the conveyor 231 (while avoiding a collision with other substrate carriers being transported on the conveyor 231), and decelerate to a halt, all within the available horizontal range of travel provided by the horizontal guide 221.

It is contemplated to include some or all of the above described features/parameters in one or more embodiments of the inventive substrate loading station.

Figure 7A:
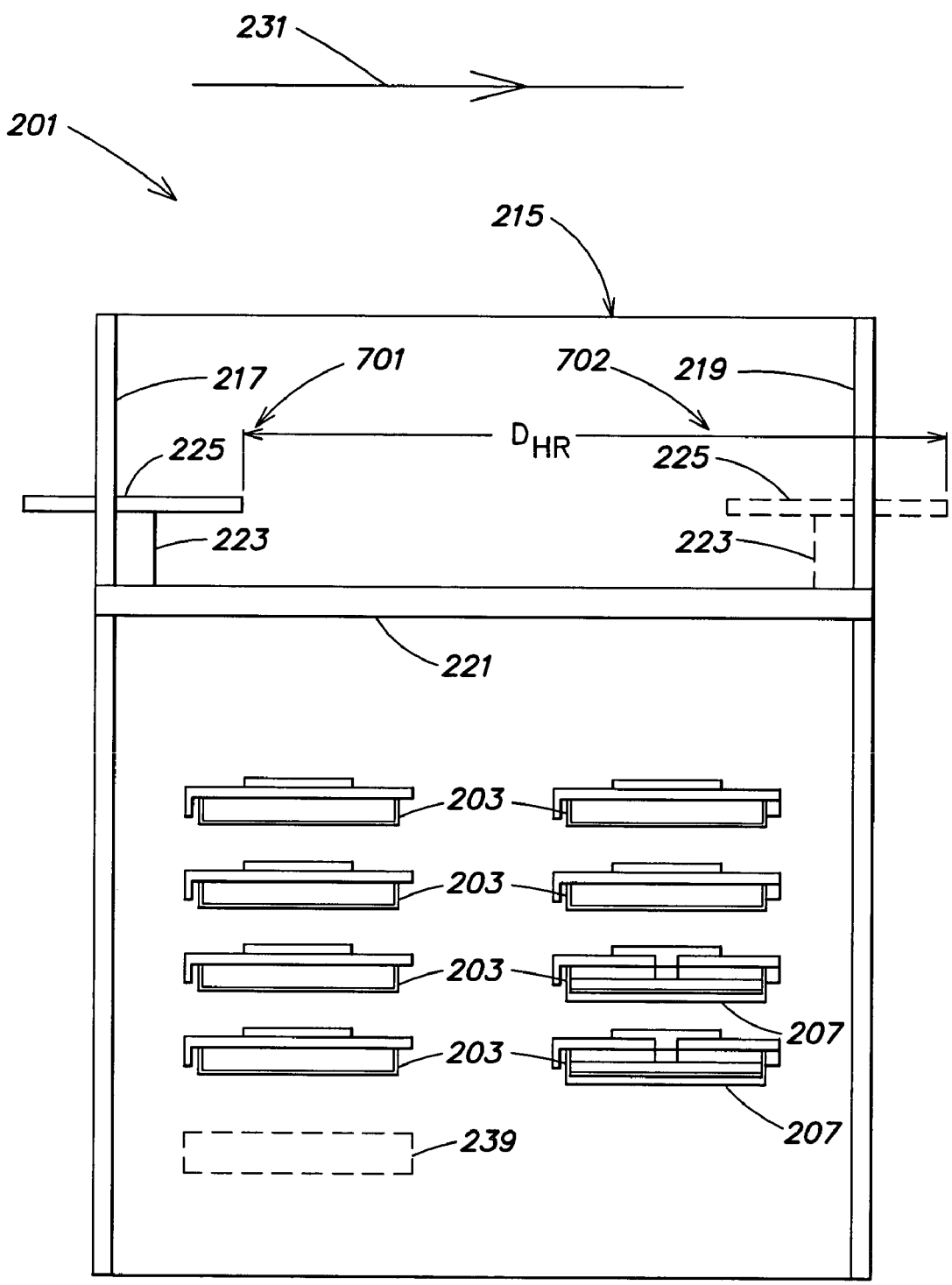
FIGS. 7A and 7B are simplified front elevational views of the inventive substrate loading station, similar to FIG. 2A.
Figure 7B:
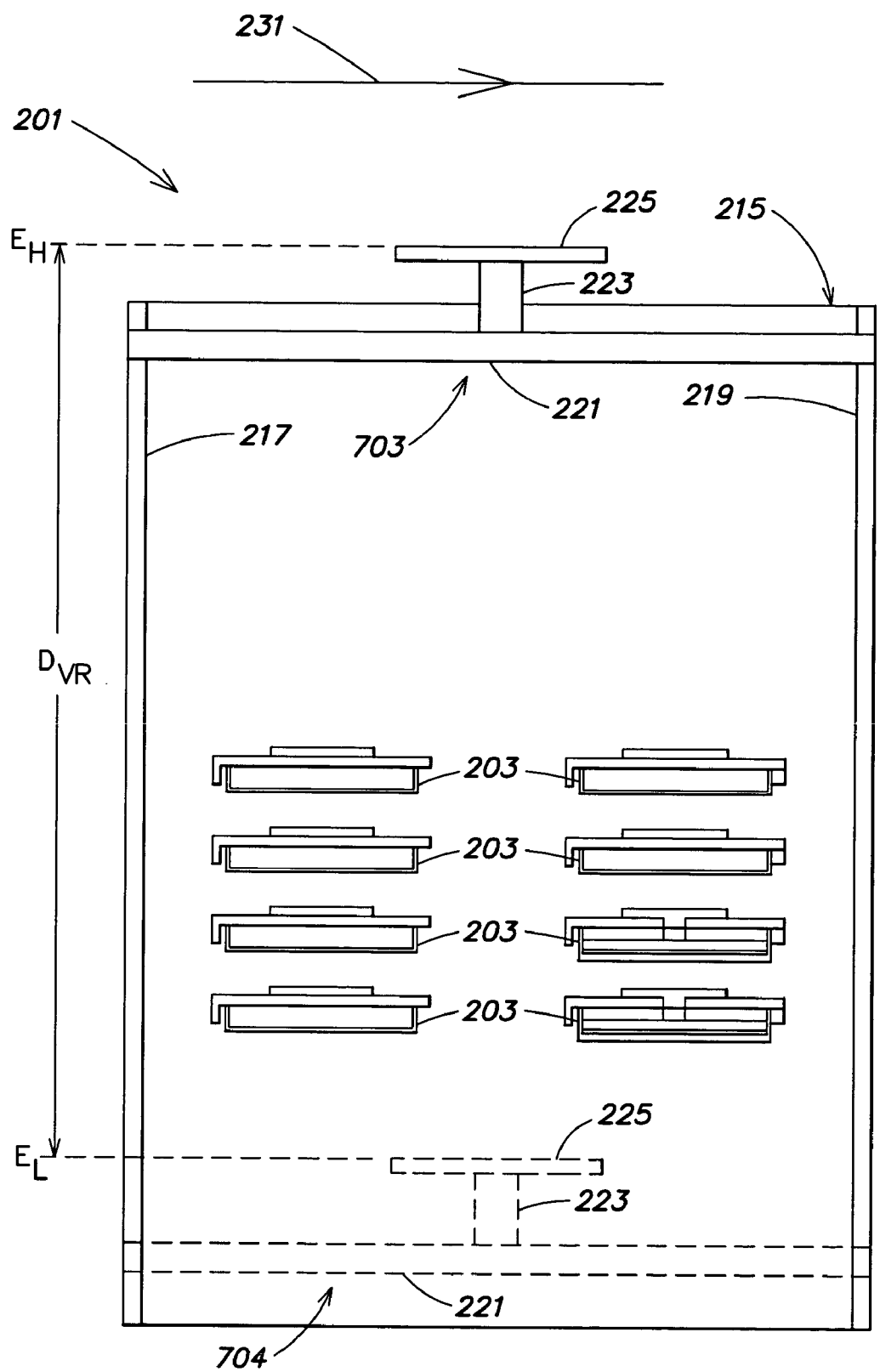
Figure 7C:
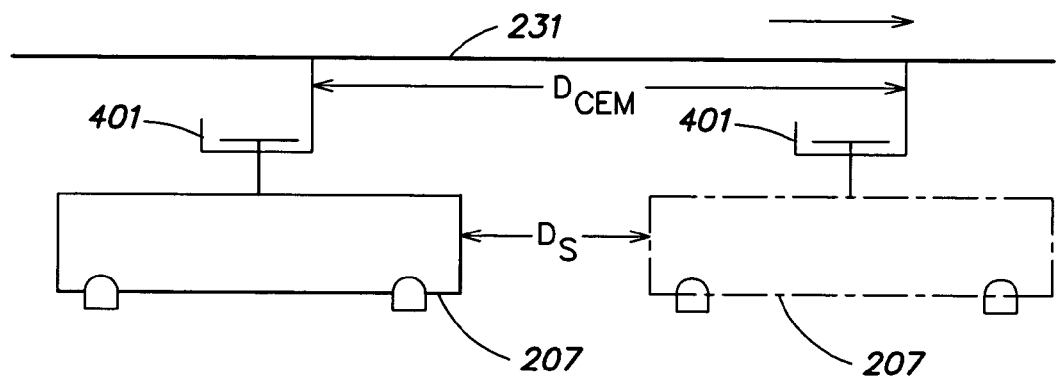
FIGS. 7C–7D are simplified schematic side views illustrating a moving conveyor similar to FIGS. 4A–4E and 6A–6E.
Figure 7D:
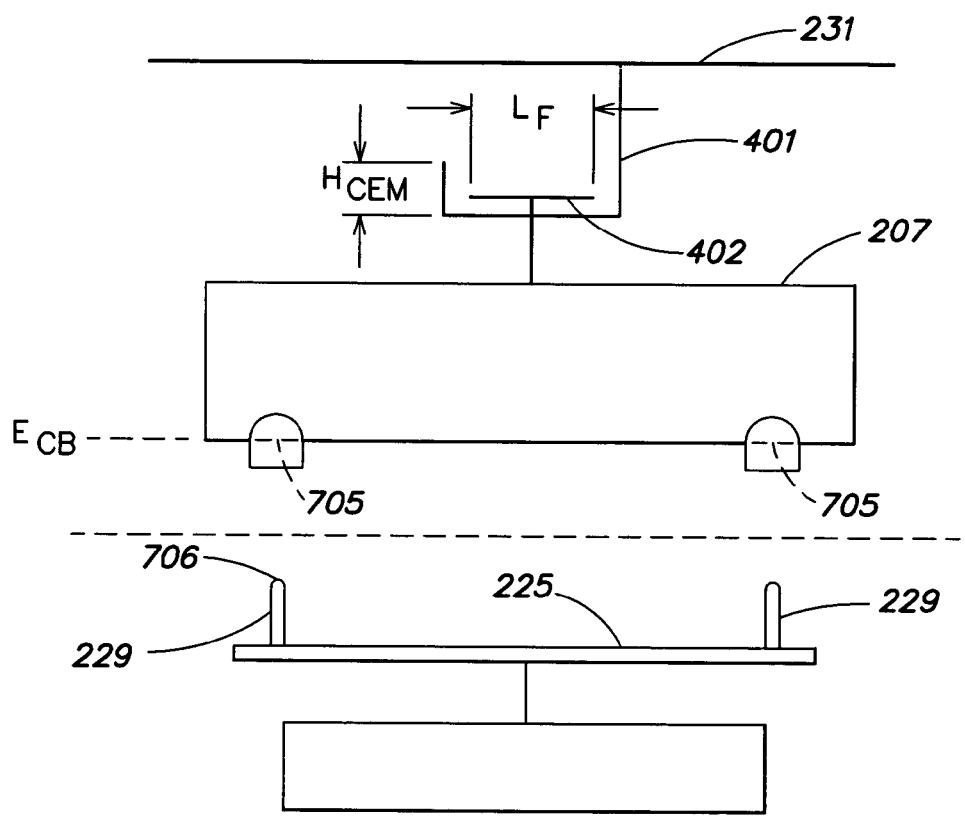

Various factors and parameters that may be considered in designing a particular embodiment of the inventive substrate loading station 201 and/or programming the controller 237 (FIG. 2A) will now be discussed with reference to FIGS. 7A–7D. FIGS. 7A and 7B are simplified front elevational views of the inventive substrate loading station 201, similar to FIG. 2A. FIGS. 7C–7D are simplified schematic side views of a substrate carrier during engagement with and/or disengagement from the conveyor 231 similar to FIGS. 4A–4E and 6A–6E.

The horizontal range of the end effector 225 of the substrate carrier handler 215 is illustrated in FIG. 7A. The end effector 225 and the support 223 are shown in solid outline at 701 in a position at the upstream limit of movement of the end effector 225 along the horizontal guide 221 of the substrate carrier handler 215. The end effector 225 and the support 223 are also shown in phantom at 702 in a position at the downstream limit of movement of the end effector 225 along the horizontal guide 221. A distance $D_{HR}$ illustrated in FIG. 7A represents the maximum horizontal range of travel of the end effector 225.

Selection of the horizontal range of travel $D_{HR}$, in addition to being influenced by the design factors discussed above, may also be influenced by the positioning of the docking stations 203 or shelves 239 (e.g., the number and/or horizontal span of the docking stations or shelves), the desired footprint for the substrate loading station 201, the size of the factory interface or processing tool coupled to the substrate loading station 201, and/or the like.

The vertical range of travel of the end effector 225 is illustrated in FIG. 7B. The end effector 225, the support 223 and the horizontal guide 221 are shown in solid outline at 703 at the upper limit of the range of vertical movement of the end effector 225. At that position, the end effector 225 is at an elevation $E_H$, which is high enough to clear the flange 402 of a substrate carrier 207 from a carrier engagement member 401 of the conveyor 231 (see FIGS. 4B–4D).

Continuing to refer to FIG. 7B, the end effector 225, the support 223 and the horizontal guide 221 are shown in phantom at 704 at the lower limit of the range of vertical movement of the end effector 225. At that position, the end effector 225 is at an elevation $E_L$, which is the lowest elevation required to service the lowest docking station (or storage location) of the substrate loading station 201. A distance $D_{VR}$ illustrated in FIG. 7B represents the maximum vertical range of travel of the end effector 225 (e.g., $D_{VR}=E_H-E_L$). Other vertical ranges of travel may be employed.

Parameters which affect an operation for engaging or disengaging a substrate carrier 207 from the conveyor 231 are illustrated in FIGS. 7C–7D. FIG. 7C shows a distance $D_S$ which separates two adjacent substrate carriers 207 being transported by the conveyor 231. The separation distance $D_S$ is related to, but less than, a distance $D_{CEM}$ between the carrier engagement members 401, and is also related to a horizontal dimension of the substrate carriers 207. Increasing the distance $D_S$ eases load and unload operations by providing a larger space and/or time period for raising, lowering, accelerating and/or decelerating a substrate carrier 207 during load and unload operations. However, increasing the distance $D_S$ generally decreases the number of substrate carriers that may be transported by the conveyor 231.

As shown in FIG. 7D, in at least one embodiment of the invention, to disengage a substrate carrier 207 from the conveyor 231, the end effector 225 raises the kinematic features 229 to an elevation equal to at least the elevation $E_{CB}$ of the bottom of the substrate carrier 207. More specifically, the kinematic features 229 are raised to an elevation greater than or equal to the elevation $E_{CB}$ plus the height $H_{CEM}$ of the seat of the carrier engagement member 401 supporting the substrate carrier 207 (e.g., to clear the flange 402 of the substrate carrier 207 from the carrier engagement member 401). Prior to lowering the disengaged substrate carrier 207, the end effector 225 is decelerated to allow the carrier engagement member 401 to move ahead of the substrate carrier 207 by a total distance greater than a length $L_F$ of the flange 402. Numerous other parameters may affect design of the inventive substrate loading station 201 and substrate handler 215.

The foregoing description discloses only an exemplary embodiment of the invention; modifications of the above disclosed apparatus and methods which fall within the scope of the invention will be readily apparent to those of ordinary skill in the art. For example, instead of employing two vertical guides in the substrate carrier handler illustrated above, only one vertical guide may be employed. Also, the substrate carrier handler may be arranged with a vertical guide that is coupled for horizontal movement along a horizontal guide instead of the horizontal guide coupled for vertical movement along vertical guides.

When the substrate carrier handler includes a vertical guide mounted for movement along a horizontal guide, the raising of the end effector to disengage a substrate carrier from a conveyor, or the lowering of the end effector to hand off the substrate carrier to the conveyor, may be accomplished by raising or lowering the end effector along the vertical guide (e.g., rather than by raising the horizontal guide relative to a pair of vertical guides). An actuator (such as a belt drive or lead screw not shown) may be provided on the support 223 of the substrate carrier handler 215 to raise the end effector 225 relative to the horizontal guide 221 to disengage a substrate carrier from the conveyor 231, or to lower the end effector 225 toward the horizontal guide 221 to hand off the substrate carrier to the conveyor 231 (in addition to or instead of raising/lowering the horizontal guide 221 along a vertical guide or guides).

The present invention may be employed to unload substrate carriers from, and load substrate carriers onto, a conveyor which transports substrate carriers in a vertical orientation. In such a case, the end effector 225 may include a reorientation mechanism for reorienting a substrate carrier between vertical and horizontal orientations, as disclosed in previously incorporated U.S. patent application Ser. No. 60/407,452, filed Aug. 31, 2002, entitled "End Effector Having Mechanism for Reorienting a Wafer Carrier Between Vertical and Horizontal Orientations".

The present invention is illustrated with respect to single substrate carriers, but the present invention may be employed with substrate carriers that hold more than one substrate.

The particular embodiment of a substrate loading station illustrated herein includes docking stations arranged in a plurality of vertical stacks. However, the above-illustrated substrate loading station may include only one vertical stack of docking stations, only one docking station or more than two vertical stacks of docking stations. The substrate loading station may include one or more storage shelves and/or one or more other substrate carrier storage facilities which are not storage shelves.

In the exemplary substrate loading station illustrated herein, the docking stations are shown to include docking grippers that suspend a substrate carrier to move it between docked and undocked positions. Alternatively the docking stations may include docking sleds or platforms which support a substrate carrier from below, via the substrate carrier's bottom or sides, etc., while moving the substrate carrier between docked and undocked positions.

Preferably, the invention is employed in a substrate loading station that comprises a frame to which the vertical and horizontal guides are coupled. In this manner, the preferred substrate loading station is modular and may be quickly installed and calibrated. In the event the substrate loading station includes one or more storage shelves (e.g., storage shelf 239 in FIG. 2A), each storage shelf also may be mounted on the frame. By mounting both the substrate carrier handler and the storage shelf or shelves to the frame, the substrate carrier handler and storage shelves have a predetermined position relative to each other. This further facilitates installation and calibration, and is another advantage of employing a modular substrate loading station. Similarly, other mechanisms such as dedicated mechanisms for loading and/or unloading substrate carriers from an overhead factory transport system may be advantageously mounted to the frame as described herein and, for example, in previously incorporated U.S. patent application Ser. No. 60/407,451, filed Aug. 31, 2002 and titled "System For Transporting Wafer Carriers".

In one aspect, the frame may be mounted to predetermined mounting locations (e.g., predrilled bolt holes, etc.) on the clean room wall, or on the front wall of a chamber (e.g., a factory interface chamber). Preferably, the wall also has predetermined mounting locations to which the docking grippers or docking platforms are mounted. Additionally, the wall may have predetermined mounting locations to which a substrate carrier opening mechanism may be mounted. When the frame, the docking mechanisms, and the substrate carrier opening mechanism are each mounted to predetermined locations on the same surface, the relative positions of each are predetermined, and installation and calibration of the substrate loading station is facilitated.

Although the conveyor described herein has been illustrated as being positioned above the substrate loading station 201, it is alternatively contemplated that the conveyor may be at or below the height of the substrate loading station or at another location positioned adjacent the substrate loading station.

The substrate loading station illustrated herein may be utilized to provide substrates to a processing tool, a metrology location, or any other location to which a substrate may be transported.

From the foregoing description, it will be understood that the inventive substrate loading station may be installed in association with a factory interface (FI) having an FI robot that transfers a substrate from a docking station of the substrate loading station to a load lock chamber of a processing tool (such as in the system of FIG. 1). Alternatively, the factory interface may be eliminated, and the load lock chamber may include a substrate handler that transfers a substrate directly from the docking station of the substrate loading station. As another alternative, the processing tool may operate at atmospheric pressure rather than under vacuum, so that the load lock chamber may be eliminated.

Figure 8A:
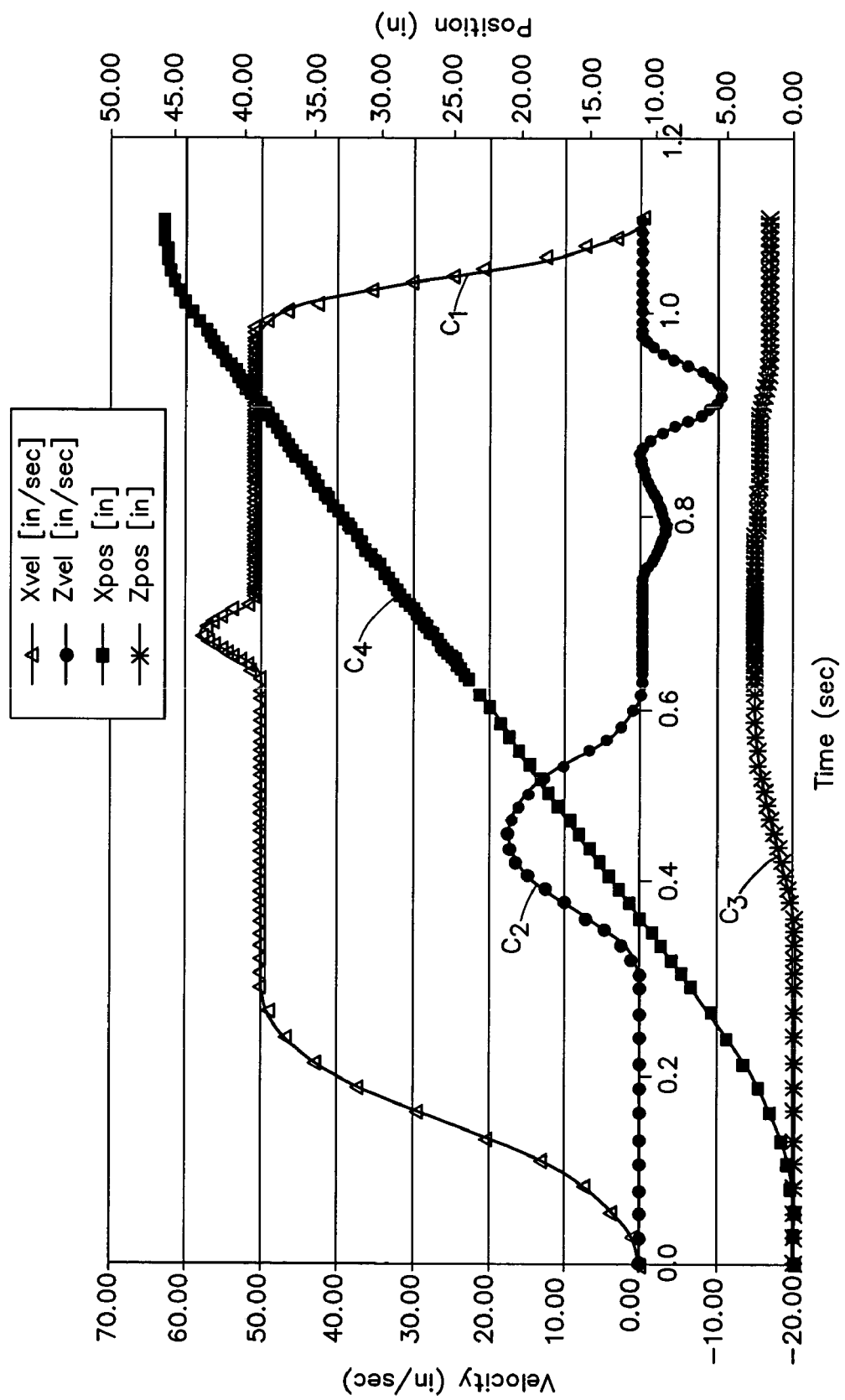
FIGS. 8A–8D are exemplary motion profiles for the end effector of the present invention.
Figure 8B:
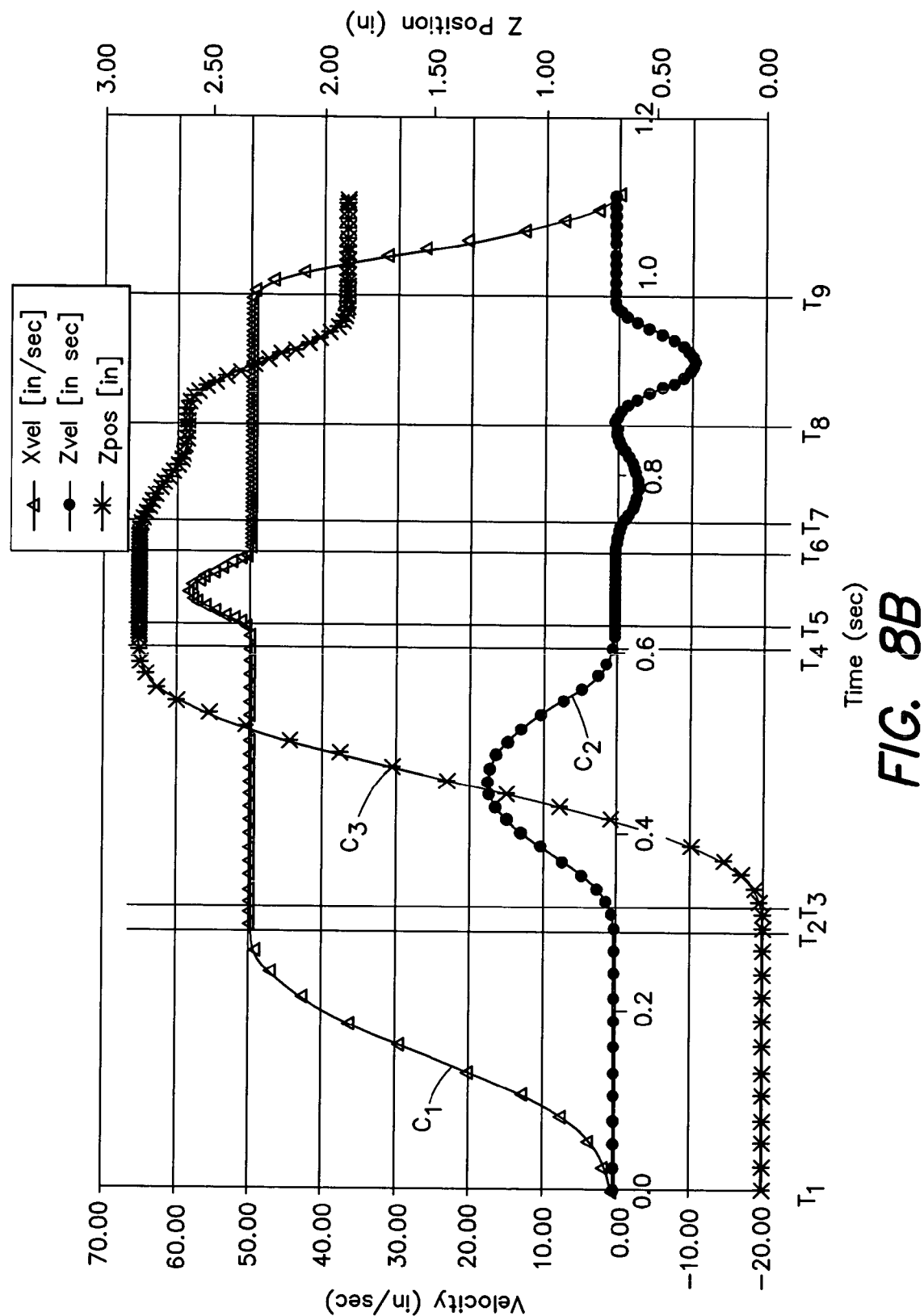
Figure 8C:
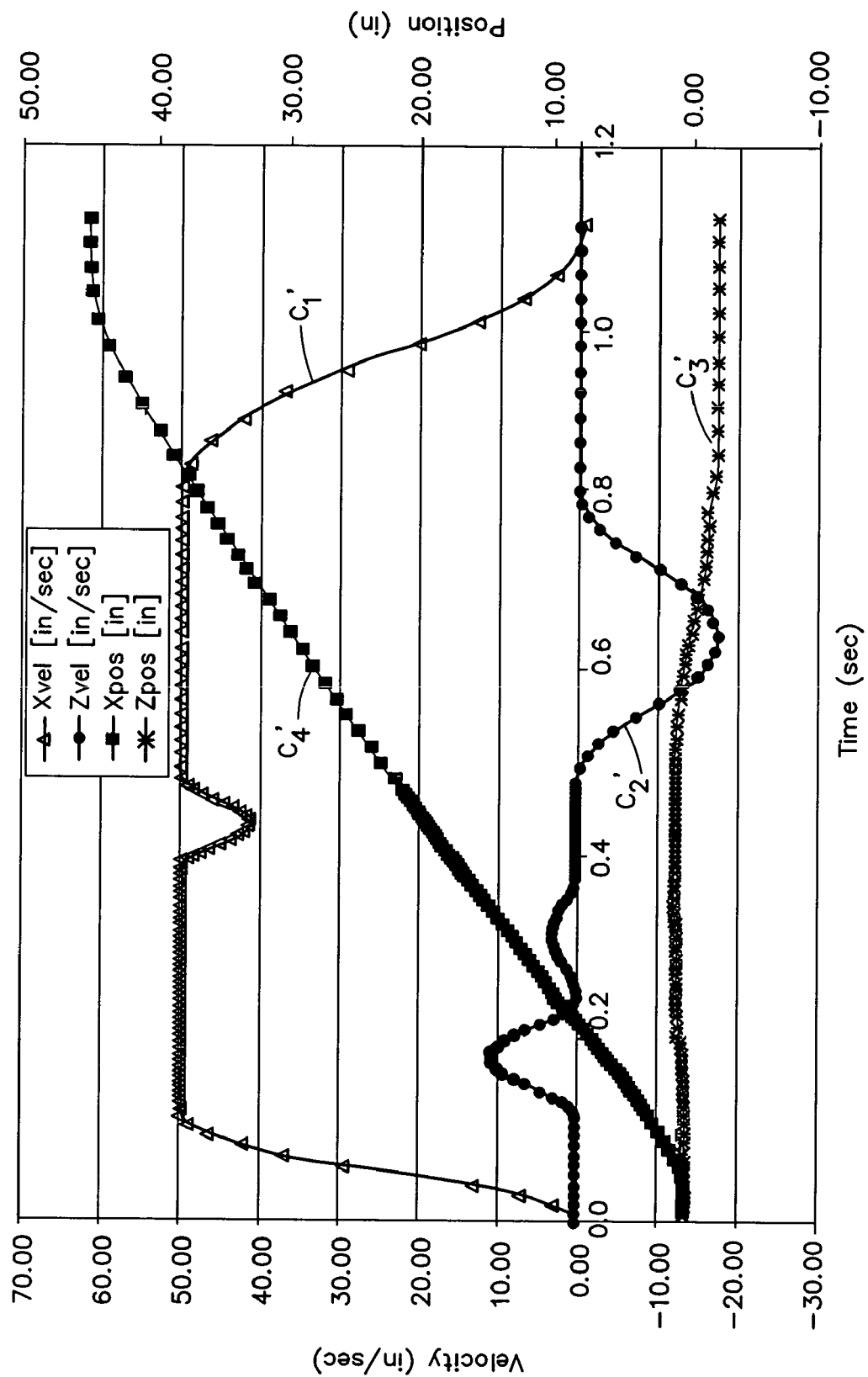
Figure 8D:
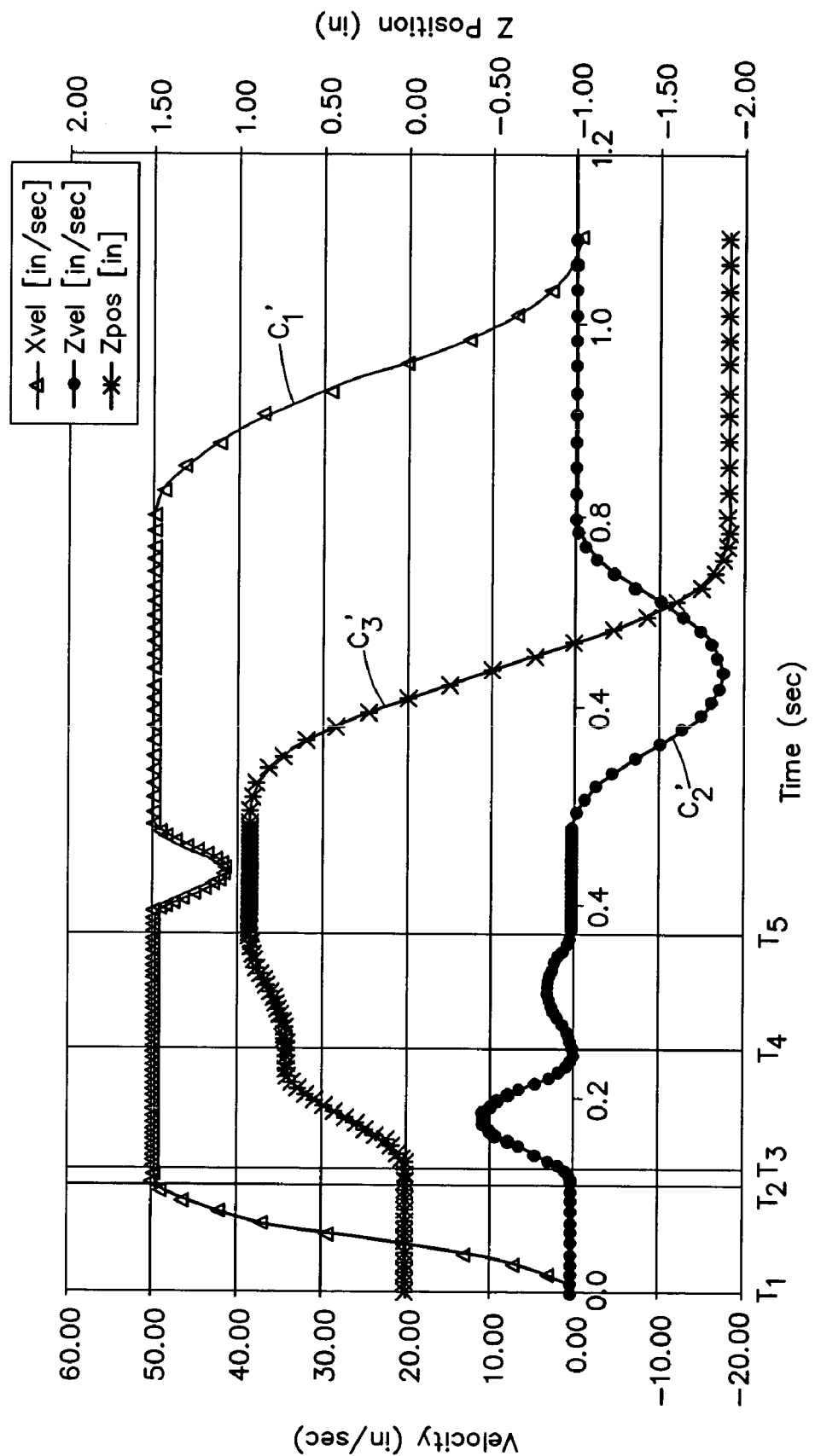

FIGS. 8A–8D are exemplary motion profiles for the end effector 225. In at least one embodiment of the invention, when such motion profiles are employed, only the sensor 233 (e.g., a "launch" sensor) need be employed (e.g., the sensor 235 may be eliminated). With reference to FIG. 8A, curve C1 illustrates end effector velocity along the x-axis (horizontal direction in which the conveyor 231 travels) during a load operation. Curve C2 illustrates end effector velocity along the z-axis (vertical direction) during a load operation. Curve C3 illustrates end effector z-axis position and curve C4 illustrates end effector x-axis position during a load operation. FIG. 8B is similar to FIG. 8A, but shows the z-axis position data enlarged. FIGS. 8C–D are similar to FIGS. 8A–B, but illustrate x-axis velocity (curve C1'), z-axis velocity (curve C2'), z-axis position (curve C3') and x-axis position (curve C4') for the end effector 225 during an unload operation. Note that FIGS. 8A–B shows the z-axis position data (curve C3) at a lower z-position during a start of a substrate carrier load operation (e.g., to compensate for the size of a substrate carrier).

With reference to FIGS. 8A–B and curves C1–C4, the end effector 225 may perform similar raisings, lowerings, and accelerations as described with reference to FIG. 5 during a load operation. For example, and with further reference to FIGS. 5 and 6A–E, after receiving a trigger signal for a load operation (step 503), the end effector 225 accelerates to match the velocity of the conveyor 231 in the x-direction (curve C1) between times T1 and T2 (step 505 and FIG. 6A). Thereafter, between times T3 and T4, the end effector 225 (curve C3) is raised to the level of the conveyor 231 (step 511 and FIG. 6B); for example, such that the flange 402 of the substrate carrier 207 to be loaded onto the conveyor 231 is above the carrier engagement member 401 that is to receive the substrate carrier 207.

Between times T5 and T6, the end effector 225 is accelerated (curve C1) above the speed of the conveyor 231 (and then is decelerated back to the speed of the conveyor 231) so that the flange 402 of the substrate carrier 207 is positioned above the carrier engagement member 401 (step 513 and FIG. 6C). At time T7, with the flange 402 of the substrate carrier 207 positioned above the carrier engagement member 401, the end effector 225 lowers (curve C3) and stops as the flange 402 contacts the carrier engagement member 401 (as shown at time T8). The end effector 225 then lowers until time T9 and the substrate carrier 207 remains on the carrier engagement member 401. The substrate carrier 207 thereby is transferred to the conveyor 231 with substantially zero velocity and/or acceleration (e.g., at time T8) (steps 515 and 517 and FIGS. 6D–E). For example, because the end effector 225 stops as the flange 402 engages the carrier engagement member 401, transfer of the substrate carrier 207 occurs with substantially zero velocity and acceleration in the z-direction (curve C2). Likewise, because end effector velocity in the x-direction is constant and matched to that of the conveyor 231 during carrier exchange (curve C1), transfer of the substrate carrier 207 occurs with substantially zero acceleration in the x-direction. Further, in at least one embodiment, no motion occurs in the y-direction during substrate carrier transfer. Accordingly, substrate carrier transfer may be performed with substantially zero acceleration in three directions and substantially zero velocity in at least two directions. Following time T9, the end effector 225 decelerates (step 519 and curve C1).

With reference to FIGS. 8C–D and curves C1–C4, the end effector 225 may perform similar raisings, lowerings, and accelerations as described with reference to FIG. 3 during an unload operation. For example, and with further reference to FIGS. 3 and 4A–E, after receiving a trigger signal for an unload operation (step 303), the end effector 225 accelerates to match the velocity of the conveyor 231 in the x-direction (curve C1') between times T1 and T2 (step 305 and FIG. 4A). Thereafter, between times T3 and T4, the end effector 225 is raised (curve C3') so that the kinematic features 229 engage the concave features 407 of the substrate carrier 207 to be unloaded from the conveyor 231 (step 311 and FIG. 4B). At time T4, the end effector 225 stops raising as the kinematic features 229 engage the concave features 407 (curves C2' and C3'). Between times T4 and T5, the end effector 225 is raised further so as to lift the flange 402 of the substrate carrier 207 off of the carrier engagement member 401 (step 311 and FIG. 4C). The substrate carrier 207 thereby is unloaded from the carrier engagement member 401 with substantially zero velocity and/or acceleration (e.g., in the x, y and/or z-directions due to the halting of z-axis motion at time T4 prior to lifting the substrate carrier 207 from the carrier engagement member 401 and due to speed matching between the end effector 225 and the conveyor 231). Following time T5, the end effector 225 decelerates and reaccelerates (step 313 and curve C1') and lowers (step 315 and curve C3') to clear the carrier engagement member 401 as previously described and as shown in FIGS. 8C–D.

Accordingly, unloading/loading of substrate carriers from/onto a moving conveyor may occur with substantially zero velocity and/or acceleration in one or more directions, more preferably in two directions, and most preferably in all directions. Substantially zero velocity and acceleration in a vertical direction are preferred; and zero velocities and/or accelerations, rather than substantially zero velocities and/or accelerations, during unloading/loading are more preferred. As used herein, "zero velocity" or "zero acceleration" mean as close to zero as possible given system variations such as conveyor height, conveyor speed, actuator repeatability, etc., system limitations such as controller resolution, actuator resolution, end effector position tolerances, etc., and/or the like. "Substantially zero velocity" or "substantially zero acceleration" mean sufficiently close to zero so that a substrate carrier may be unloaded from and/or loaded onto a moving conveyor and/or carrier engagement member without damaging a substrate contained within the substrate carrier and/or generating potentially damaging particles. For example, a substrate carrier may be contacted with a relatively small velocity. In one embodiment, an end effector may raise vertically rapidly, and then slow down to a relatively small or substantially zero velocity prior to contacting a substrate carrier. A similar small (or substantially zero) acceleration also may be employed. Similar load operations may be performed. In one embodiment, substrates or substrate carriers are contacted in a vertical direction with less than about 0.5 G of force, and in another embodiment with less than about 0.15 G of force. Other contact force values may be employed.

While the present invention has been described primarily with reference to unloading/loading substrate carriers that contain only a single wafer carrier from/onto a moving conveyor, it will be understood that substrate carriers that contain multiple substrates similarly may be unloaded from or loaded onto a moving conveyor. Further, the present invention may be employed within systems that transport both single substrate carriers and multiple substrate carriers (e.g., 25 substrate carrier front opening unified pods). Likewise, the present invention may be employed to unload individual substrates from and/or load individual substrates onto a moving conveyor (e.g., substrates that are not contained within a closed substrate carrier). For example, substrates may be transported via a conveyor using an open substrate carrier, a substrate support, a substrate tray or another substrate transport device that allows the end effector 225 (or a modified version thereof) to directly place a substrate on or remove a substrate from the substrate transport device of the conveyor using similar end effector movements and/or motion profiles. Such individual substrates thereby may be transferred to a docking station or other load port, or directly into a load lock chamber and/or processing tool if desired. For example, a substrate may be transferred directly from the end effector 225 to a substrate handling robot of a factory interface and/or processing tool (e.g., via a direct "blade-to-blade" transfer or via an intermediate transfer location). Multiple individual substrates similarly may be unloaded/loaded from/onto a moving conveyor.

Accordingly, while the present invention has been disclosed in connection with exemplary embodiments thereof, it should be understood that other embodiments may fall within the spirit and scope of the invention as defined by the following claims.

The invention claimed is:

1. An apparatus adapted to supply substrates to a processing tool, comprising:
    a substrate carrier handler adapted to transport a substrate carrier to a first load port of the processing tool, the substrate carrier handler including an end effector adapted to support the substrate carrier; and
    a controller coupled to the substrate carrier handler and operative to control the substrate carrier handler such that the end effector of the substrate carrier handler disengages the substrate carrier from a substrate carrier conveyor while the substrate carrier is in motion and being transported by the substrate carrier conveyor.

2. The apparatus of claim 1 wherein the controller is operative to control the substrate carrier handler such that the end effector of the substrate carrier handler substantially matches a motion of the substrate carrier during at least a portion of the disengagement of the substrate carrier from the substrate carrier conveyor.

3. The apparatus of claim 2 wherein the controller is operative to control the substrate carrier handler such that the end effector of the substrate carrier handler substantially matches a velocity of the substrate carrier during at least a portion of the disengagement of the substrate carrier from the substrate carrier conveyor.

4. The apparatus of claim 3 wherein the controller is operative to control the substrate carrier handler such that the end effector of the substrate carrier handler substantially matches a speed and position of the substrate carrier in a horizontal direction during at least a portion of the disengagement of the substrate carrier from the substrate carrier conveyor.

5. The apparatus of claim 1, wherein the controller is further operative to control the substrate carrier handler such that the end effector is moved so as to remain adjacent and below the substrate carrier as the substrate carrier is being transported by the substrate carrier conveyor.

6. The apparatus of claim 5, wherein the controller is further operative to control the substrate carrier handler such that the end effector of the substrate carrier handler is raised, while being moved in a horizontal direction, so as to disengage the substrate carrier from the substrate carrier conveyor.

7. The apparatus of claim 1 wherein the controller is further operative to control the substrate carrier handler such that the end effector contacts the substrate carrier with at least one of a substantially zero velocity or less and a substantially zero acceleration or less in a vertical direction to disengage the substrate carrier from the substrate carrier conveyor.

8. The apparatus of claim 7 wherein the controller is further operative to control the substrate carrier handler such that the end effector contacts the substrate carrier with substantially zero acceleration or less in a horizontal direction of travel of the substrate carrier conveyor to disengage the substrate carrier from the substrate carrier conveyor.

9. The apparatus of claim 1, wherein the substrate carrier handler includes a vertical guide and a horizontal guide coupled to the vertical guide.

10. The apparatus of claim 9, wherein:
the substrate carrier handler includes a pair of vertical guides;
the horizontal guide is mounted for vertical movement along the vertical guides; and
the end effector is mounted for horizontal movement along the horizontal guide.

11. The apparatus of claim 1, wherein the substrate carrier handler is adapted to move the end effector to at least an elevation at which the substrate carrier conveyor transports substrate carriers.

12. The apparatus of claim 1, wherein the first load port comprising a first docking station, and further comprising at least one other docking station vertically disposed relative to the first docking station.

13. The apparatus of claim 12, further comprising two columns of docking stations, the first docking station being included in one of the two columns of docking stations.

14. The apparatus of claim 1, further comprising at least one sensor coupled to the controller and adapted to indicate a position of a component of the substrate carrier conveyor.

15. The apparatus of claim 1, wherein the substrate carrier is a single substrate carrier.

16. The apparatus of claim 1, wherein the end effector of the substrate carrier handler includes a horizontally oriented platform having a plurality of kinematic features.

17. The apparatus of claim 1, wherein the conveyor is positioned above the substrate carrier handler.

18. The apparatus of claim 1, further comprising at least one storage shelf adapted to store a substrate carrier;
wherein the substrate carrier handler is adapted to transport a substrate carrier between the first load port and the at least one storage shelf.

19. The apparatus of claim 1 wherein the controller is further operative to control the substrate carrier handler such that the end effector of the substrate carrier handler transfers the substrate carrier to the substrate carrier conveyor while the substrate carrier conveyor is in motion.

20. The apparatus of claim 19 wherein the controller is operative to control the substrate carrier handler such that the end effector of the substrate carrier handler substantially matches a motion of the substrate carrier conveyor during at least a portion of the transfer of the substrate carrier to the substrate carrier conveyor.

21. The apparatus of claim 20 wherein the controller is operative to control the substrate carrier handler such that the end effector of the substrate carrier handler substantially matches a velocity of the substrate carrier conveyor during at least a portion of the transfer of the substrate carrier to the substrate carrier conveyor.

22. The apparatus of claim 21 wherein the controller is operative to control the substrate carrier handler such that the end effector of the substrate carrier handler substantially matches a speed of the substrate carrier conveyor in a horizontal direction during at least a portion of the transfer of the substrate carrier to the substrate carrier conveyor.

23. The apparatus of claim 19 wherein the controller is further operative to control the substrate carrier handler such that the substrate carrier contacts the substrate carrier conveyor with at least one of a substantially zero velocity or less and a substantially zero acceleration or less in a vertical direction to load the substrate carrier onto the substrate carrier conveyor.

24. The apparatus of claim 23 wherein the controller is further operative to control the substrate carrier handler such that the substrate carrier contacts the substrate carrier conveyor with substantially zero acceleration or less in a horizontal direction of travel of the substrate carrier conveyor to load the substrate carrier onto the substrate carrier conveyor.

25. The apparatus of claim 1 wherein the controller is operative to automatically retract the end effector from the conveyor in response to a predetermined event.

26. The apparatus of claim 25 wherein the predetermined event comprises at least one of a power failure and an emergency shutdown.

27. The apparatus of claim 1 wherein the controller is further operative to control the substrate carrier handler such that the end effector contacts the substrate carrier with substantially zero velocity or less in a vertical direction to disengage the substrate carrier from the substrate carrier conveyor.

28. An apparatus adapted to supply substrates to a processing tool, comprising:
a substrate carrier handler adapted to transport a substrate carrier to a first load port of the processing tool, the substrate carrier handler including:
a vertical guide;
a horizontal guide coupled to the vertical guide; and
an end effector adapted to support the substrate carrier and to move vertically relative to the vertical guide and horizontally relative to the horizontal guide; and
a controller coupled to the substrate carrier handler and operative to control the substrate carrier handler such that the end effector of the substrate carrier handler disengages the substrate carrier from a substrate carrier conveyor positioned adjacent the substrate carrier handler.

29. The apparatus of claim 28 wherein the substrate carrier handler includes a pair of vertical guides and wherein:
the horizontal guide is adapted to move vertically along the pair of vertical guides; and the end effector is adapted to move horizontally along the horizontal guide.

30. The apparatus of claim 28 wherein the controller is further operative to control the substrate carrier handler such that the end effector of the substrate carrier handler disengages the substrate carrier from the substrate carrier conveyor while the substrate carrier is in motion and being transported by the substrate carrier conveyor.

31. The apparatus of claim 28 wherein the controller is operative to automatically retract the end effector from the conveyor in response to a predetermined event.

32. The apparatus of claim 31 wherein the predetermined event comprises at least one of a power failure and an emergency shutdown.

33. A method of transferring a substrate carrier, comprising:
conveying the substrate carrier on a substrate carrier conveyor positioned adjacent a substrate loading station that includes a substrate carrier handler adapted to transport the substrate carrier to a load port of a processing tool; and
employing an end effector of the substrate carrier handler of the substrate loading station to disengage the substrate carrier from the substrate carrier conveyor while the substrate carrier is in motion and being transported by the substrate carrier conveyor.

34. The method of claim 33, wherein employing the end effector of the substrate carrier handler of the substrate loading station to disengage the substrate carrier comprises, moving the end effector so as to substantially match a motion of the substrate carrier during at least a portion of the disengagement of the substrate carrier from the substrate carrier conveyor.

35. The method of claim 34, wherein moving the end effector so as to substantially match a motion of the substrate carrier comprises moving the end effector so as to substantially match a velocity of the substrate carrier during at least a portion of the disengagement of the substrate carrier from the substrate carrier conveyor.

36. The method of claim 34, wherein moving the end effector so as to substantially match a motion of the substrate carrier comprises moving the end effector so as to substantially match a speed and position of the substrate carrier along a horizontal direction during at least a portion of the disengagement of the substrate carrier from the substrate carrier conveyor.

37. The method of claim 33, wherein disengaging the substrate carrier includes raising the end effector to contact a bottom of the substrate carrier.

38. The method of claim 33, wherein disengaging the substrate carrier comprises moving the end effector along a horizontal guide that is part of the substrate carrier handler.

39. The method of claim 38, wherein disengaging the substrate carrier includes raising the horizontal guide along at least one vertical guide that is part of the substrate carrier handler.

40. The method of claim 33, wherein disengaging the substrate carrier includes moving the end effector to an elevation at which the substrate carrier is conveyed.

41. The method of claim 33 wherein employing the end effector of the substrate carrier handler of the substrate loading station to disengage the substrate carrier comprises contacting the substrate carrier with the end effector with at least one of a substantially zero velocity or less and a substantially zero acceleration or less in a vertical direction to disengage the substrate carrier from the substrate carrier conveyor.

42. The method of claim 41 wherein employing the end effector of the substrate carrier handler of the substrate loading station to disengage the substrate carrier comprises contacting the substrate carrier with the end effector with substantially zero acceleration or less in a horizontal direction of travel of the substrate carrier conveyor to disengage the substrate carrier from the substrate carrier conveyor.

43. The method of claim 33, wherein conveying the substrate carrier includes conveying the substrate carrier above the substrate loading station.

44. The method of claim 33 further comprising employing the end effector to transfer the substrate carrier to the substrate carrier conveyor while the substrate carrier conveyor is in motion.

45. The method of claim 44, wherein employing the end effector to transfer the substrate carrier to the substrate carrier conveyor comprises moving the end effector so as to substantially match a motion of the substrate carrier conveyor during at least a portion of the transfer of the substrate carrier to the substrate carrier conveyor.

46. The method of claim 45, wherein moving the end effector so as to substantially match a motion of the substrate carrier conveyor comprises moving the end effector so as to substantially match a velocity of the substrate carrier conveyor.

47. The method of claim 45, wherein moving the end effector so as to substantially match a motion of the substrate carrier conveyor comprises moving the end effector so as to substantially match a speed of the substrate carrier conveyor along a horizontal direction.

48. The method of claim 44, wherein transferring the substrate carrier to the substrate carrier conveyor includes lowering the end effector to hand off the substrate carrier to a carrier engagement member of the substrate carrier conveyor.

49. The method of claim 48, wherein the end effector is lowered by lowering a horizontal guide.

50. The method of claim 48, wherein transferring the substrate carrier to the substrate carrier conveyor includes moving the end effector to an elevation at which the substrate carrier conveyor transports substrate carriers.

51. The method of claim 44 wherein employing the end effector to transfer the substrate carrier to the substrate carrier conveyor while the substrate carrier conveyor is in motion comprises contacting the substrate carrier conveyor with the substrate carrier with at least one of a substantially zero velocity or less and a substantially zero acceleration or less in a vertical direction to load the substrate carrier onto the substrate carrier conveyor.

52. The method of claim 51 wherein employing the end effector to transfer the substrate carrier to the substrate carrier conveyor while the substrate carrier conveyor is in motion comprises contacting the substrate carrier conveyor with the substrate carrier with substantially zero acceleration or less in a horizontal direction of travel of the substrate carrier conveyor to load the substrate carrier onto the substrate carrier conveyor.

53. The method of claim 32 further comprising automatically retracting the end effector from the conveyor in response to a predetermined event.

54. The method of 53 wherein the predetermined event comprises at least one of a power failure and an emergency shutdown.

55. A method of transferring a substrate carrier to a substrate loading station, comprising:
- conveying the substrate carrier on a substrate carrier conveyor positioned adjacent to the substrate loading station, the substrate loading station having:
  - a substrate carrier handler adapted to transport the substrate carrier to a first load port of a processing tool, the substrate carrier handler including:
    - a vertical guide;
    - a horizontal guide coupled to the vertical guide; and
    - an end effector adapted to support the substrate carrier and to move vertically relative to the vertical guide and horizontally relative to the horizontal guide; and
- employing the end effector of the substrate carrier handler of the substrate loading station to disengage the substrate carrier from the substrate carrier conveyor.

56. The method of claim 55 wherein the substrate carrier handler includes a pair of vertical guides and wherein:
- the horizontal guide is adapted to move vertically along the pair of vertical guides; and
- the end effector is adapted to move horizontally along the horizontal guide.

57. The method of claim 55 wherein employing the end effector to disengage the substrate carrier from the substrate carrier conveyor comprises disengaging the substrate carrier from the substrate carrier conveyor while the substrate carrier is in motion.

58. The method of claim 55 further comprising automatically retracting the end effector from the conveyor in response to a predetermined event.

59. The method of 58 wherein the predetermined event comprises at least one of a power failure and an emergency shutdown.

60. An apparatus adapted to supply substrates to a processing tool, comprising:
- a substrate carrier handler adapted to transport a substrate carrier to a first load port of the processing tool, the substrate carrier handler including an end effector adapted to support the substrate carrier; and
- a controller coupled to the substrate carrier handler and operative to control the substrate carrier handler to:
  - move the end effector of the substrate carrier handler in a horizontal direction to substantially match a motion of the substrate carrier as the substrate carrier is being transported by a substrate carrier conveyor;
  - raise the end effector to engage the substrate carrier and to disengage the substrate carrier from the substrate carrier conveyor; and
  - transport the substrate carrier to the first load port.

61. The apparatus of claim 60, wherein the controller is operative to control the substrate carrier handler so as to decelerate the horizontal motion of the end effector after the raising step.

62. The apparatus of claim 61, wherein the controller is operative to control the substrate carrier handler so as to lower the end effector after the decelerating step.

63. The apparatus of claim 62, wherein the controller is operative to control the substrate carrier handler so as to accelerate the horizontal motion of the end effector after the decelerating step and before the lowering step.

64. The apparatus of claim 62, wherein the controller is operative to control the substrate carrier handler so as to halt the horizontal motion of the end effector after the lowering step.

65. The apparatus of claim 60, wherein the controller is operative to control the substrate carrier handler so as to hand off the substrate carrier to the first load port after the transporting step.

66. The apparatus of claim 60 wherein the controller is operative to automatically retract the end effector from the conveyor in response to a predetermined event.

67. The apparatus of claim 66 wherein the predetermined event comprises at least one of a power failure and an emergency shutdown.

68. A method of operating a substrate carrier handler, comprising:
- moving an end effector of the substrate carrier handler in a horizontal direction to substantially match motion of the substrate carrier as the substrate carrier is being transported by a substrate carrier conveyor;
- raising the end effector to engage the substrate carrier and to disengage the substrate carrier from the substrate carrier conveyor; and
- transporting the substrate carrier to a load port.

69. The method of claim 68, wherein the moving step includes moving the end effector along a horizontal guide of the substrate carrier handler.

70. The method of the 68, further comprising decelerating the horizontal motion of the end effector after the raising step.

71. The method of claim 70, further comprising lowering the end effector after the decelerating step.

72. The method of claim 71, further comprising accelerating the horizontal motion of the end effector after the decelerating step and before the lowering step.

73. The method of claim 71, further comprising halting the horizontal motion of the end effector after the lowering step.

74. The method of claim 68, further comprising handing off the substrate carrier to the load port after the transporting step.

75. The method of claim 68, wherein the raising step includes raising a horizontal guide of the substrate carrier handler.

76. The method of claim 68 further comprising automatically retracting the end effector from the conveyor in response to a predetermined event.

77. The method of 76 wherein the predetermined event comprises at least one of a power failure and an emergency shutdown.

78. An apparatus adapted to supply substrates to a processing tool, comprising:
- a substrate carrier handler adapted to transport a substrate carrier to a first load port of the processing tool, the substrate carrier handler including an end effector adapted to support the substrate carrier; and
- a controller coupled to the substrate carrier handler and operative to control the substrate carrier handler such that the end effector of the substrate carrier handler disengages the substrate carrier from a substrate carrier conveyor while the substrate carrier is in motion by:
  - determining a speed of the substrate carrier conveyor;
  - determining a first motion profile for the end effector based on the speed of the substrate carrier conveyor; and
  - employing the first motion profile to control motion of the end effector during at least a portion of disengagement of the substrate carrier from the substrate carrier conveyor.

79. The apparatus of claim 78 wherein the controller is further operative to abort disengagement of the substrate carrier from the substrate carrier conveyor if the speed of the substrate carrier conveyor is outside of a predetermined range.

80. The apparatus of claim 78 wherein the controller is further operative to control the substrate carrier handler such that the end effector of the substrate carrier handler transfers the substrate carrier to the substrate carrier conveyor while the substrate carrier conveyor is in motion by:
    determining a second motion profile for the end effector based on substrate carrier conveyor speed; and
    employing the second motion profile to control motion of the end effector during at least a portion of transfer of the substrate carrier to the substrate carrier conveyor.

81. The apparatus of claim 80 wherein the controller is further operative to abort transfer of the substrate carrier to the substrate carrier conveyor if substrate carrier conveyor speed is outside of a predetermined range.

82. A method of transferring a substrate carrier, comprising:
    conveying the substrate carrier on a substrate carrier conveyor positioned adjacent a substrate loading station that includes a substrate carrier handler adapted to transport the substrate carrier to a load port;
    determining a speed of the substrate carrier conveyor;
    determining a first motion profile for an end effector of the substrate carrier handler based on the speed of the substrate carrier conveyor; and
    employing the first motion profile to control motion of the end effector during at least a portion of disengagement of the substrate carrier from the substrate carrier conveyor.

83. The method of claim 82 further comprising:
    determining a second motion profile for the end effector based on substrate carrier conveyor speed; and
    employing the second motion profile to control motion of the end effector during at least a portion of transfer of the substrate carrier to the substrate carrier conveyor.

84. A computer program product adapted to control disengagement of a substrate carrier from a substrate carrier conveyor positioned adjacent a substrate loading station that includes a substrate carrier handler adapted to transport the substrate carrier to a load port, the computer program product comprising:
    a medium readable by a computer, the computer readable medium having computer program code adapted to:
        determine a speed of the substrate carrier conveyor;
        determine a first motion profile for an end effector of the substrate carrier handler based on the speed of the substrate carrier conveyor; and
        employ the first motion profile to control motion of the end effector during at least a portion of disengagement of the substrate carrier from the substrate carrier conveyor.

85. The computer program product of claim 84 further comprising computer program code adapted to:
    determine a second motion profile for the end effector based on substrate carrier conveyor speed; and
    employ the second motion profile to control motion of the end effector during at least a portion of transfer of the substrate carrier to the substrate carrier conveyor.

86. An apparatus adapted to supply substrates to a processing tool, comprising:
    an end effector adapted to support a substrate and transport the substrate to a first load port of the processing tool; and
    a controller coupled to the end effector and operative to control the end effector such that the end effector disengages the substrate from a moving conveyor while the substrate is in motion and being transported by the conveyor.

87. The apparatus of claim 86 wherein the controller is further operative to control the end effector such that the end effector transfers the substrate to the conveyor while the conveyor is in motion.

88. A method of transferring a substrate, comprising:
    conveying the substrate on a conveyor positioned adjacent a substrate loading station that includes an end effector adapted to support the substrate and to transport the substrate to a load port of a processing tool; and
    employing the end effector of the substrate loading station to disengage the substrate from the conveyor while the substrate is in motion and being transported by the conveyor.

89. The method of claim 88 further comprising employing the end effector to transfer the substrate to the conveyor while the conveyor is in motion.

90. An apparatus comprising:
    a substrate carrier handler adapted to transport a substrate carrier to a first load port of a processing tool, the substrate carrier handler including an end effector adapted to support the substrate carrier; and
    a controller coupled to the substrate carrier handler and operative to control the substrate carrier handler such that the end effector of the substrate carrier handler transfers the substrate carrier to a substrate carrier conveyor while the substrate carrier conveyor is in motion.

* * * * *